(12) United States Patent
Bhutta et al.

(10) Patent No.: US 10,692,699 B2
(45) Date of Patent: Jun. 23, 2020

(54) IMPEDANCE MATCHING WITH RESTRICTED CAPACITOR SWITCHING

(71) Applicant: Reno Technologies, Inc., Wilmington, DE (US)

(72) Inventors: Imran Ahmed Bhutta, Moorestown, NJ (US); Michael Gilliam Ulrich, Delran, NJ (US)

(73) Assignee: RENO TECHNOLOGIES, INC., Wilmington, DE (US)

( * ) Notice: Subject to any disclaimer, the term of this patent is extended or adjusted under 35 U.S.C. 154(b) by 0 days.

(21) Appl. No.: 16/415,764

(22) Filed: May 17, 2019

(65) Prior Publication Data

US 2019/0272978 A1    Sep. 5, 2019

Related U.S. Application Data

(63) Continuation-in-part of application No. 15/816,351, filed on Nov. 17, 2017, now abandoned, which is a continuation-in-part of application No. 15/450,495, filed on Mar. 6, 2017, which is a continuation-in-part of application No. 15/196,821, filed on Jun. 29, 2016.

(60) Provisional application No. 62/185,998, filed on Jun. 29, 2015, provisional application No. 62/303,625, filed on Mar. 4, 2016, provisional application No. 62/424,162, filed on Nov. 18, 2016.

(51) Int. Cl.
*H01J 37/32* (2006.01)
*H03H 7/38* (2006.01)
*H05K 7/20* (2006.01)

(52) U.S. Cl.
CPC ......... *H01J 37/32183* (2013.01); *H03H 7/38* (2013.01); *H05K 7/20154* (2013.01); *H05K 7/20336* (2013.01)

(58) Field of Classification Search
CPC . H01J 37/32183; H03H 7/38; H05K 7/20154; H05K 7/20336
See application file for complete search history.

(56) References Cited

U.S. PATENT DOCUMENTS

| 3,681,672 A | 8/1972 | Strauss |
| 3,828,281 A | 8/1974 | Chambers |
| 4,110,700 A | 8/1978 | Rosen et al. |

(Continued)

FOREIGN PATENT DOCUMENTS

| EP | 0840349 | 5/1998 |
| EP | 0840350 | 5/1998 |
| WO | 2006096589 | 9/2006 |

*Primary Examiner* — Samuel S Outten
(74) *Attorney, Agent, or Firm* — The Belles Group, P.C.

(57) ABSTRACT

In one embodiment, an RF impedance matching network for a plasma chamber is disclosed. It includes a variable capacitor comprising a plurality of capacitors comprising first coarse capacitors each having a substantially similar first coarse capacitance, second coarse capacitors each having a substantially similar second coarse capacitance, and fine capacitors having different capacitances that increase in value. At least one of the fine capacitors has a capacitance greater than the first coarse capacitance. A control circuit is configured cause a gradual increase in the total capacitance of the variable capacitor by switching in, in a predetermined order, each of the first coarse capacitors, followed by each of the second coarse capacitors, only switching in the fine capacitors whose capacitance is less than a capacitance of a next coarse capacitor of the coarse capacitors predetermined to be switched in next.

21 Claims, 20 Drawing Sheets

(56) References Cited

U.S. PATENT DOCUMENTS

| | | |
|---|---|---|
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,545,966 A | 8/1996 | Ramos et al. |
| 5,654,679 A | 8/1997 | Mavretic et al. |
| 5,815,047 A | 9/1998 | Sorensen et al. |
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |
| 6,252,354 B1 | 6/2001 | Collins et al. |
| 6,400,012 B1 | 6/2002 | Miller et al. |
| 6,424,232 B1 | 7/2002 | Mavretic et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,199,678 B2 | 4/2007 | Matsuno |
| 7,212,406 B2 | 5/2007 | Kaishian et al. |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | McKinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | McKinzie, III |
| 7,728,602 B2 | 6/2010 | Valcore et al. |
| 7,745,955 B2 | 6/2010 | Kirchmeier et al. |
| 7,755,300 B2 | 7/2010 | Kishinevsky et al. |
| 7,764,140 B2 | 7/2010 | Nagarkatti et al. |
| 7,777,567 B2 | 8/2010 | Polizze |
| 7,852,170 B2 | 12/2010 | McKinzie, III |
| 7,863,996 B2 | 1/2011 | Cotter et al. |
| 7,868,556 B2 | 1/2011 | Kia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | McKinzie, III |
| 8,040,068 B2 | 10/2011 | Coumou et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,207,798 B1 | 6/2012 | Wright |
| 8,217,731 B2 | 7/2012 | McKinzie, III |
| 8,217,732 B2 | 7/2012 | McKinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | McKinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | McKinzie, III |
| 8,559,907 B2 | 10/2013 | Burgener et al. |
| 8,564,381 B2 | 10/2013 | McKinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlieek et al. |
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,083,343 B1 | 7/2015 | Li |
| 9,190,993 B1 | 11/2015 | Li |
| 9,306,533 B1 | 4/2016 | Anton |
| 9,425,736 B2 | 8/2016 | Kelkar |
| 2002/0060914 A1 | 5/2002 | Porter |
| 2003/0007372 A1 | 1/2003 | Porter |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0039194 A1 | 2/2010 | Darabi et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2010/0253442 A1 | 10/2010 | Mu |

(56) References Cited

U.S. PATENT DOCUMENTS

| | | |
|---|---|---|
| 2011/0025436 A1 | 2/2011 | Hadji-Abdolhamid et al. |
| 2011/0241781 A1 | 10/2011 | Owen et al. |
| 2011/0247696 A1 | 10/2011 | Zolock et al. |
| 2012/0001496 A1 | 1/2012 | Yamamoto et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |
| 2017/0063101 A1 | 3/2017 | Sultenfuss et al. |

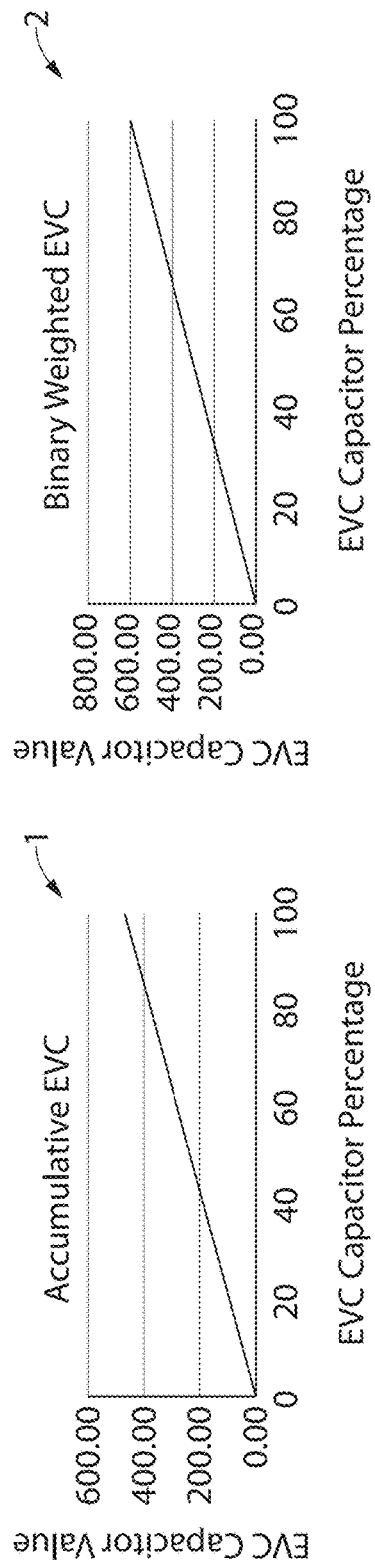
FIG. 12
FIG. 13
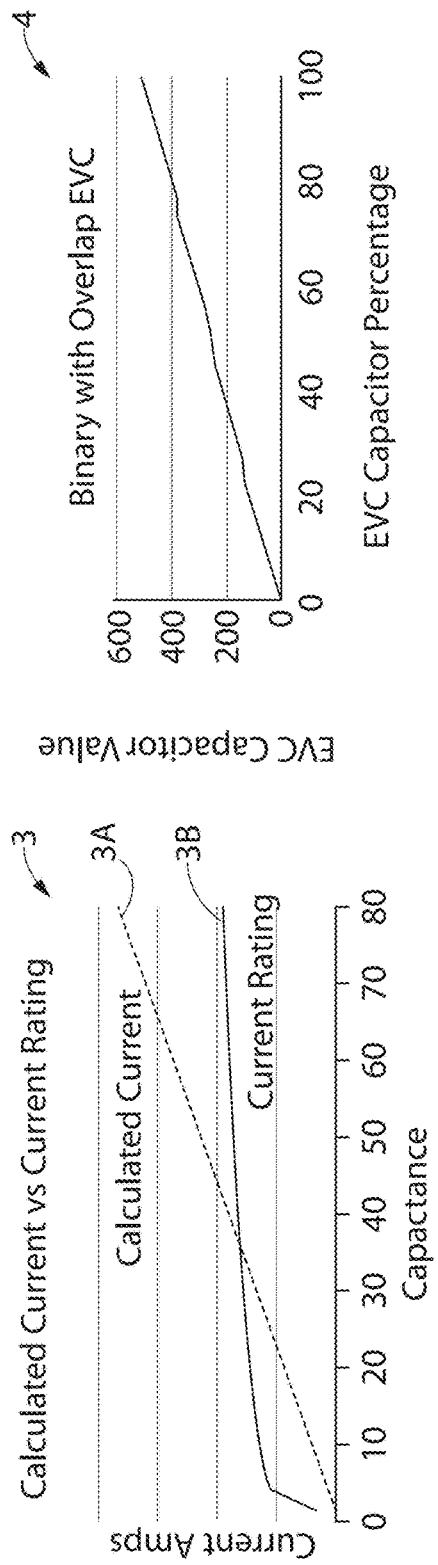
FIG. 14
FIG. 15

IMPEDANCE MATCHING WITH RESTRICTED CAPACITOR SWITCHING

CROSS-REFERENCE TO RELATED PATENT APPLICATIONS

The present application is a continuation in part of U.S. patent application Ser. No. 15/816,351, filed Nov. 17, 2017, which is a continuation in part of U.S. patent application Ser. No. 15/450,495, filed Mar. 6, 2017, which is a continuation in part of U.S. patent application Ser. No. 15/196,821, filed Jun. 29, 2016, which claims the benefit of U.S. Provisional Patent Application No. 62/185,998 filed on Jun. 29, 2015. U.S. patent application Ser. No. 15/450,495 further claims the benefit of U.S. Provisional Patent Application No. 62/303,625, filed Mar. 4, 2016. U.S. patent application Ser. No. 15/816,351 further claims the benefit of U.S. Provisional Patent Application No. 62/424,162, filed Nov. 18, 2016. The disclosures of the aforementioned priority applications are incorporated herein by reference in their entirety.

BACKGROUND

Variable capacitors are used in many applications, such as matching networks and variable filters. They allow for the precise tuning, after assembly, of frequency and/or impedance in applications needing a dynamic system response, such as in plasma processes. The ability to dynamically change impedance and frequency response provides more flexibility for the applications variable capacitors are used in, and can compensate for variations from unit-to-unit. Some examples of variable capacitors are vacuum variable capacitors (VVCs) and electronically variable capacitors (EVCs).

In electronic circuits, matching networks are used to match the source impedance to the load impedance and vice versa. That is, the source, being of some impedance with a resistive part and a reactive part, will be terminated into the complex conjugate impedance, and the load impedance will be driven by the complex conjugate of its impedance. The complex conjugate is used to eliminate the reactive part of the impedance, leaving only the resistive part, and the resistive part is made equal. This is done so that maximum power transfer can be achieved at the load.

In plasma applications, the load impedance can vary depending on several factors, such as time, power level, pressure, gas flow, chemistry of the gasses, and whether the plasma has been struck. Accordingly, the matching network must be able to automatically vary itself to ensure that the maximum power transfer is achieved. This helps with repeatability in both the depositing and etching.

EVCs use switches to add or remove fixed capacitors, such as an MLCC (multi-layer ceramic capacitor), in a circuit. The capacitor and switch are placed in series. This circuit is then placed in parallel with other capacitor/switch circuits. The parallel circuits allow the capacitors to be simply added or subtracted in the circuit, depending on how many switches are opened or closed. In the case where all the switches are open, the EVC will be at its lowest capacitance value. In the case where they are all closed, the EVC will be at its highest capacitance value.

There are different approaches for arranging and choosing the capacitors of the EVC such that the EVC can provide progressively increasing capacitance values. There is need for an arrangement of capacitors for an EVC that provides the needed capacitance values while avoiding overlap in solutions, and while using a lower number of capacitors, switches, and associated hardware, and thus taking up less space.

BRIEF SUMMARY

In one aspect, an impedance matching network includes an input configured to operably couple to a radio frequency (RF) source; an output configured to operably couple to a plasma chamber for manufacturing a semiconductor; a variable capacitor comprising a plurality of capacitors operably coupled in parallel, the plurality of capacitors comprising coarse capacitors comprising (a) first coarse capacitors each having a substantially similar first coarse capacitance; and (b) second coarse capacitors each having a substantially similar second coarse capacitance; and fine capacitors having different capacitances that increase in value, wherein at least one of the fine capacitors has a capacitance greater than the first coarse capacitance; a plurality of switches, wherein each switch of the plurality of switches is operably coupled in series with a corresponding capacitor of the plurality of capacitors and configured to switch in and out the corresponding capacitor; wherein each capacitor of the plurality of capacitors provides a change to a total capacitance of the variable capacitor when the capacitor is switched in; a control circuit operably coupled to the variable capacitor, the control circuit configured to (a) determine which of the coarse capacitors and the fine capacitors to have switched in to achieve an impedance match and (b) cause the determined coarse and fine capacitors to be switched in; wherein the control circuit is further configured to cause a gradual increase in the total capacitance of the variable capacitor by switching in, in a predetermined order, each of the first coarse capacitors, followed by each of the second coarse capacitors; and only switching in the fine capacitors whose capacitance is less than a capacitance of a next coarse capacitor of the coarse capacitors predetermined to be switched in next.

In another aspect, a method of matching an impedance includes operably coupling an input of a matching network to an RF source; operably coupling an output of the matching network to a plasma chamber for manufacturing a semiconductor, the matching network comprising a variable capacitor comprising a plurality of capacitors operably coupled in parallel, the plurality of capacitors comprising coarse capacitors comprising (a) first coarse capacitors each having a substantially similar first coarse capacitance; and (b) second coarse capacitors each having a substantially similar second coarse capacitance; and fine capacitors having different capacitances that increase in value, wherein at least one of the fine capacitors has a capacitance greater than the first coarse capacitance; a plurality of switches, wherein each switch of the plurality of switches is operably coupled in series with a corresponding capacitor of the plurality of capacitors and configured to switch in and out the corresponding capacitor; wherein each capacitor of the plurality of capacitors provides a change to a total capacitance of the variable capacitor when the capacitor is switched in; and a control circuit; determining, by the control circuit, which of the coarse capacitors and the fine capacitors to have switched in to achieve an impedance match; and causing, by the control circuit, the determined coarse and fine capacitors to be switched in; wherein the control circuit is further configured to cause a gradual increase in the total capacitance of the variable capacitor by switching in, in a predetermined order, each of the first coarse capacitors, followed by each of the second coarse capacitors; and only switching in the fine capacitors whose capacitance is less than a capacitance of a next coarse capacitor of the coarse capacitors predetermined to be switched in next.

In another aspect, a method of manufacturing a semiconductor includes operably coupling an input of a matching network to an RF source; operably coupling an output of the matching network to a plasma chamber, plasma chamber configured to deposit a material layer onto the substrate or etch a material layer from the substrate, the matching network comprising a variable capacitor comprising a plurality of capacitors operably coupled in parallel, the plurality of capacitors comprising coarse capacitors comprising (a) first coarse capacitors each having a substantially similar first coarse capacitance; and (b) second coarse capacitors each having a substantially similar second coarse capacitance; and fine capacitors having different capacitances that increase in value, wherein at least one of the fine capacitors has a capacitance greater than the first coarse capacitance; a plurality of switches, wherein each switch of the plurality of switches is operably coupled in series with a corresponding capacitor of the plurality of capacitors and configured to switch in and out the corresponding capacitor; wherein each capacitor of the plurality of capacitors provides a change to a total capacitance of the variable capacitor when the capacitor is switched in; and a control circuit; placing a substrate in the plasma chamber; energizing plasma within the plasma chamber by coupling RF power from the RF source into the plasma chamber to perform a deposition or etching; and determining, by the control circuit, which of the coarse capacitors and the fine capacitors to have switched in to achieve an impedance match; and causing, by the control circuit, the determined coarse and fine capacitors to be switched in; wherein the control circuit is further configured to cause a gradual increase in the total capacitance of the variable capacitor by switching in, in a predetermined order, each of the first coarse capacitors, followed by each of the second coarse capacitors; and only switching in the fine capacitors whose capacitance is less than a capacitance of a next coarse capacitor of the coarse capacitors predetermined to be switched in next.

In another aspect, a semiconductor processing tool includes a plasma chamber configured to deposit a material onto a substrate or etch a material from the substrate; and an impedance matching circuit operably coupled to the plasma chamber, matching circuit comprising an input configured to operably couple to an RF source; an output configured to operably couple to the plasma chamber for manufacturing a semiconductor; a variable capacitor comprising a plurality of capacitors operably coupled in parallel, the plurality of capacitors comprising coarse capacitors comprising (a) first coarse capacitors each having a substantially similar first coarse capacitance; and (b) second coarse capacitors each having a substantially similar second coarse capacitance; and fine capacitors having different capacitances that increase in value, wherein at least one of the fine capacitors has a capacitance greater than the first coarse capacitance; a plurality of switches, wherein each switch of the plurality of switches is operably coupled in series with a corresponding capacitor of the plurality of capacitors and configured to switch in and out the corresponding capacitor; wherein each capacitor of the plurality of capacitors provides a change to a total capacitance of the variable capacitor when the capacitor is switched in; a control circuit operably coupled to the variable capacitor, the control circuit configured to (a) determine which of the coarse capacitors and the fine capacitors to have switched in to achieve an impedance match and (b) cause the determined coarse and fine capacitors to be switched in; wherein the control circuit is further configured to cause a gradual increase in the total capacitance of the variable capacitor by switching in, in a predetermined order, each of the first coarse capacitors, followed by each of the second coarse capacitors; and only switching in the fine capacitors whose capacitance is less than a capacitance of a next coarse capacitor of the coarse capacitors predetermined to be switched in next.

BRIEF DESCRIPTION OF THE DRAWINGS

The present disclosure will become more fully understood from the detailed description and the accompanying drawings, wherein:

FIG. 12 is a graph of capacitance for an accumulative EVC according to one embodiment.

FIG. 13 is a graph of a capacitance for a binary weighted EVC according to one embodiment.

FIG. 14 is a graph of current versus current rating according to one embodiment.

FIG. 15 is a graph of a capacitance for a binary with overlap EVC according to one embodiment.

DETAILED DESCRIPTION

Figure 1:
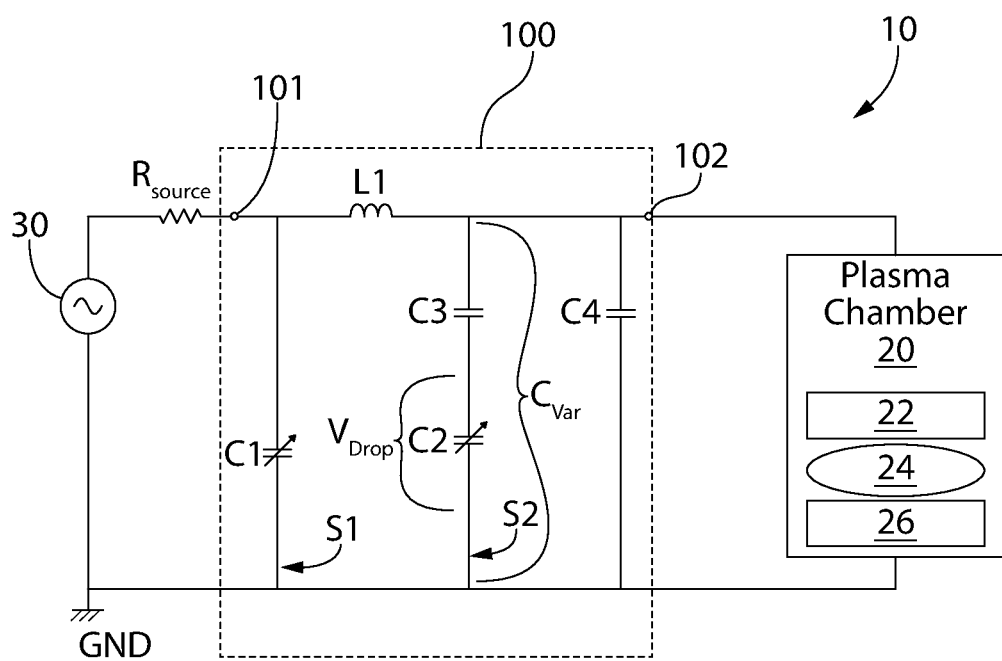
FIG. 1 is a system incorporating a pi matching network according to one embodiment.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present invention may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

Ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

Voltage Reduction Circuit

Referring now to FIG. 1, a system 10 incorporating a pi matching network 100 according to one embodiment is shown. In this embodiment, the system 10 is a system for manufacturing semiconductors. In other embodiments, the matching network can form part of any system attempting to match a source impedance to a load impedance to maximize power transfer to the load.

In the exemplified embodiment, the system 10 includes a radio frequency (RF) source 30 having a substantially fixed output impedance $R_{source}$ (e.g., 50 ohms). The RF source 30 generates an RF signal that is received at the input 101 of the matching network 100. The RF source 30 is also operably coupled to chassis ground GND. The RF source 30 may be an RF generator of a type that is well-known in the art to generate an RF signal at an appropriate frequency and power for the process performed within the load 20. The RF source 30 may be electrically connected to the RF input 101 of the impedance matching network 100 using a coaxial cable or similar means, which for impedance matching purposes may have the same fixed (or substantially fixed) impedance as the RF source 30.

The system 10 further includes a load. In the exemplified embodiment, the load is a plasma chamber 20 for manufacturing a semiconductor. The semiconductor device can be a microprocessor, a memory chip, or another type of integrated circuit or device.

As is known in the art, the plasma within a plasma chamber 20 typically undergoes certain fluctuations outside of operational control so that the impedance presented by the plasma chamber 20 is a variable impedance. Since the variable impedance of the plasma chamber 20 cannot be fully controlled, an impedance matching network may be used to create an impedance match between the plasma chamber 20 and the RF source 30. In other embodiments, the load can be any load of variable impedance that can utilize a matching network.

The plasma chamber 20 can include a first electrode 22 and a second electrode 26, and in processes that are well known in the art, the first and second electrodes, in conjunction with appropriate control systems (not shown) and the plasma in the plasma chamber 120, enable one or both of deposition of materials onto a substrate 24 and etching of materials from the substrate 24. The plasma chamber 20 can receive an RF signal from the output 102 of the matching network 100 and thereby receive RF power from the RF source 30 to energize plasma within the plasma chamber 20 to perform the deposition or etching.

The matching network 100 can consist of a single module within a single housing designed for electrical connection to the RF source 30 and plasma chamber 20. In other embodiments, the components of the matching network 100 can be located in different housings, some components can be outside of the housing, and/or some components can share a housing with a component outside the matching network 100.

The matching network 100 provides impedance matching for the RF source 30 and the plasma chamber 20. The matching network 100 is operably coupled between the RF source 30 and the plasma chamber 20. The matching network 100 includes an input 101 configured to operably couple to the RF source 30, and an output 102 configured to operably couple to the plasma chamber 20. The matching network 100 further includes a first variable capacitor C1 and a second variable capacitor C2. In a preferred embodiment, the variable capacitors C1, C2 are EVCs, though in other embodiments, other types of variable capacitors can be used, such as VVCs.

In this first embodiment, the matching network 100 is a pi network. The first variable capacitor C1 forms part of a first shunt S1 parallel to the RF source 30, and the second variable capacitor C2 forms part of a second shunt S2 separate from the first shunt S1. Put differently, the first variable capacitor C1 is parallel to the input 101, and the second variable capacitor C2 is parallel to the output 102. Further, a first inductor L1 is located between the first shunt S1 and the second shunt S2. In other embodiments, a second inductor L2 can be located between the second shunt S2 and the output 102.

The first variable capacitor C1 has a first capacitance, and the second variable capacitor C2 has a second capacitance. The first capacitance and the second capacitance are configured to be altered to create an impedance match at the input. As will be discussed further herein, however, the invention is not limited to pi matching networks, as other types of matching networks can be utilized.

To reduce a voltage on the second variable capacitor C2, the matching network 100 further includes a third capacitor C3 in series with the second variable capacitor C2. Components or nodes are said to be "in series" if the same current flows through each. In the exemplified embodiment, the third capacitor C3 forms part of the second shunt S2, though the invention is not so limited. In other embodiments, the third capacitor C3 can be at different locations, provided the third capacitor C3 is positioned to reduce a voltage on the second variable capacitor C2 (the reduced voltage being, for example, an alternating current or radio frequency voltage). For example, the positions of C2 and C3 in FIG. 1 can be reversed. Alternative embodiments are discussed below. In the embodiments discussed, the third or additional capacitor is a non-variable capacitor, though in other embodiments a variable capacitor can be used.

In the exemplified embodiment, a fourth capacitor C4 is included. The fourth capacitor C4 is parallel to the second shunt S2 and helps to offset the total capacitance. In other embodiments, the fourth capacitor C4 can be omitted.

Figure 2:
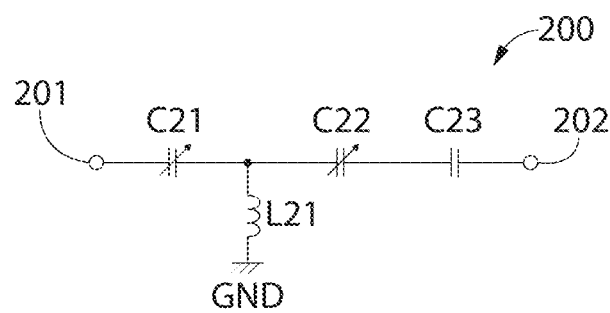
FIG. 2 is a T matching network according to one embodiment.

FIG. 2 is a T matching network 200 according to a second embodiment. The matching network 200 includes an input 201 configured to operably couple to an RF source and an output 202 configured to operably couple to a load. A first variable capacitor C21 is in series with the input 201, and a second variable capacitor C22 is in series with the output 202. An inductor L21 at one end is coupled at a node between the two variable capacitors C21, C22 and coupled at another end to chassis ground. As with the first embodiment, the third capacitor C23 is in series with the second variable capacitor C22 to reduce a voltage on the second variable capacitor C22.

Figure 3:
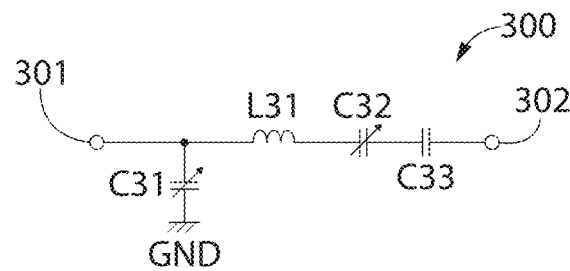
FIG. 3 is an L matching network according to one embodiment.

FIG. 3 is an L matching network 300 according to a third embodiment. The matching network 300 includes an input 301 configured to operably couple to an RF source and an output 302 configured to operably couple to a load. A first variable capacitor C31 is parallel to the input 301. Further, a second variable capacitor C32 is in series with the output 302. Further, an inductor L31 is in series with the output 302. As with the first embodiment, the third capacitor C33 is in series with the second variable capacitor C32 to reduce a voltage on the second variable capacitor C32.

Figure 4:
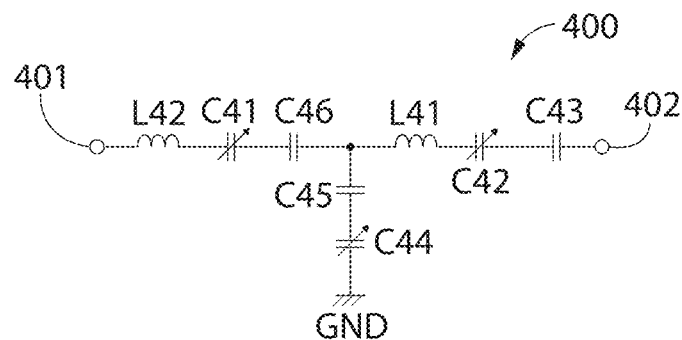
FIG. 4 is a T-variation matching network according to one embodiment.

FIG. 4 is a matching network 400 that is a variation on a T matching network according to a fourth embodiment. The matching network 400 includes an input 401 configured to operably couple to an RF source and an output 402 configured to operably couple to a load. A first variable capacitor C41 is in series with the input 401, a second variable capacitor C42 is in series with the output 202, and another variable capacitor C44 at one end is coupled at a node between the two variable capacitors C41, C42 and coupled at another end to chassis ground. Further, capacitor C46 is in series with capacitor C41, capacitor C43 is in series with capacitor C42, and capacitor C45 is in series with capacitor C44. An inductor L41 is in series with the output 402, and an inductor L42 is in series with the input 401. As with the first embodiment, the third capacitor C43 reduces a voltage on the second variable capacitor C42. Further, capacitors C41 and C45 reduce voltage on capacitors C46 and C44, respectively.

Figure 5:
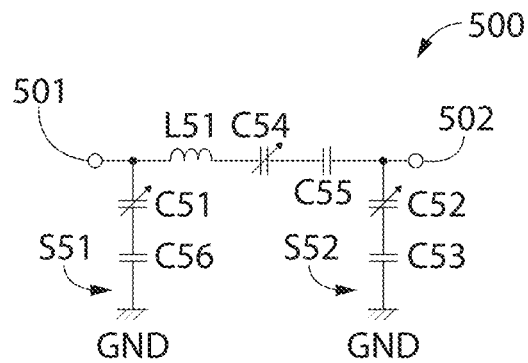
FIG. 5 is a pi-variation matching network according to one embodiment.

FIG. 5 is a matching network 500 that is a variation on a pi matching network according to a fifth embodiment. The matching network 500 includes an input 501 configured to operably couple to an RF source and an output 502 configured to operably couple to a load. A first variable capacitor C51 forms part of a first shunt S51 parallel to the input 501, a second variable capacitor C52 forms part of a second shunt S52 separate from and parallel to the output 502, and another variable capacitor C54 is located between variable capacitors C51 and C52. Capacitor C56 is in series with variable capacitor C51, capacitor C53 is in series with variable capacitor C52, and capacitor C55 is in series with variable capacitor C54. Further, a first inductor L51 is in series with variable capacitor C54. As with the first embodiment, the third capacitor C53 reduces a voltage on the second variable capacitor C52. Further, capacitors C55 and C56 reduce a voltage on variable capacitors C54 and C51, respectively.

Figure 6:
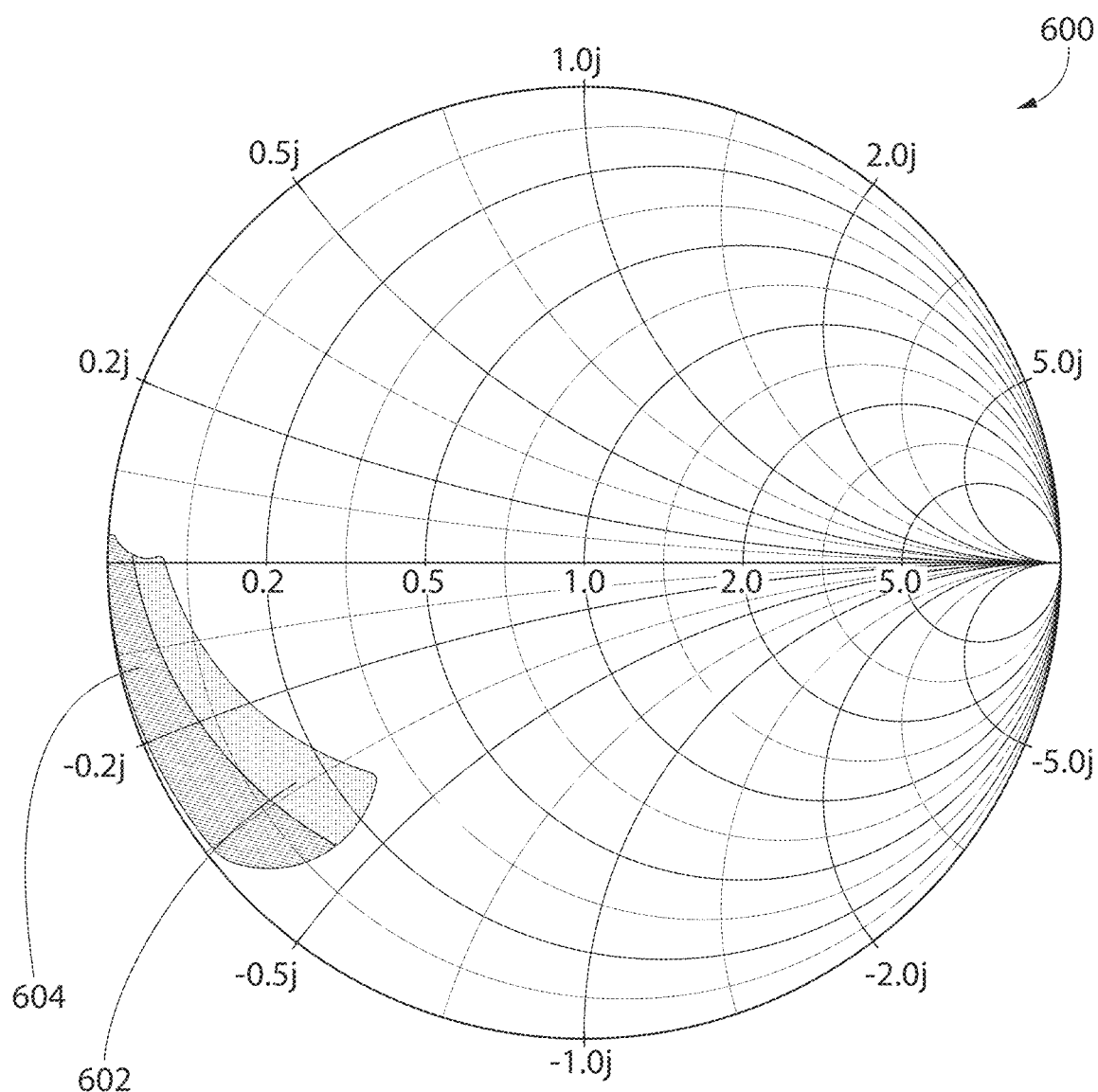
FIG. 6 is an impedance Smith chart for the pi matching network of FIG. 1 where capacitor C3 is omitted.

FIG. 6 shows an impedance Smith chart 600 for the matching network of FIG. 1 before the additional capacitor C3 is added. An impedance Smith chart shows the different possible impedances for a matching network. In FIG. 6, the first region 602 and the second region 604 together represent the total number of possible impedances. There is a maximum voltage across C2 (e.g., 1600V). The first region 601 represents the impedance range where the maximum voltage is not exceeded (within spec), and the second region 602 represents the impedance range where the maximum voltage is exceeded (out of spec). It can be seen that about half of the impedance range of the matching network cannot be used at full power due to over voltage.

In the embodiment discussed below, the values of the additional fixed capacitor C3 and variable capacitors C2 (see FIG. 1) are chosen to reduce the voltage $V_{Drop}$ on the variable capacitor C2 by half at the maximum capacitance (compared to the voltage on the variable capacitor C2 without the presence of the additional capacitor C3). This is only an example, and the voltage drop can be altered depending on the application, the desired voltage drop, and/or the availability of components.

The voltage drop $V_{Drop}$ across the variable capacitor C2 (see FIG. 1) can be calculated by the following equation:

$$V_{DROP} = V_{C2} * \frac{1}{C2} \Big/ \left(\frac{1}{C2} + \frac{1}{C3}\right)$$

If $C2_{Max}=C3$, then the formula can be simplified as below, where $C2_{Max}=C3=C$.

$$V_{DROP} = V_{C2} * \frac{1}{C} \Big/ \left(\frac{1}{C} + \frac{1}{C}\right) = V_{C2} * 1/(1+1) = \frac{V_{C2}}{2}$$

As a result, $V_{Drop}$ is equal to half of the voltage that was originally capacitor C2 ($V_{C2}$) when C3 was not included.

$$V_{Drop} = \frac{V_{C2}}{2}$$

Continuing with this example, the next step is to find the maximum capacitance required for the variable and fixed capacitors. In this case, the total series capacitance CVar is equal to the maximum capacitance of the original variable capacitor C2. The capacitance CVar can be calculated by the following equation:

$$CVar_{Max} = \left(\frac{1}{C2_{Max}} + \frac{1}{C3}\right)^{-1}$$

If $C2_{Max}=C3=C$, the equation can be modified as follows:

$$\frac{1}{CVar_{Max}} = \left(\frac{1}{C} + \frac{1}{C}\right) = \frac{2}{C}$$

C is then solved for as follows:

$$C = 2 * CVar_{Max}$$

The minimum value for variable capacitor C2, $C2_{Min}$, can be found by using the previously calculated value for C3 and replacing the $CVar_{Max}$ with the minimum capacitance, $CVar_{Min}$, as in the following equations:

$$\frac{1}{C2_{Min}} = \left(\frac{1}{CVar_{Min}} - \frac{1}{C3}\right)$$

-continued $$C2_{Min} = \left(\frac{1}{CVar_{Min}} - \frac{1}{C3}\right)^{-1}$$

Figure 7:
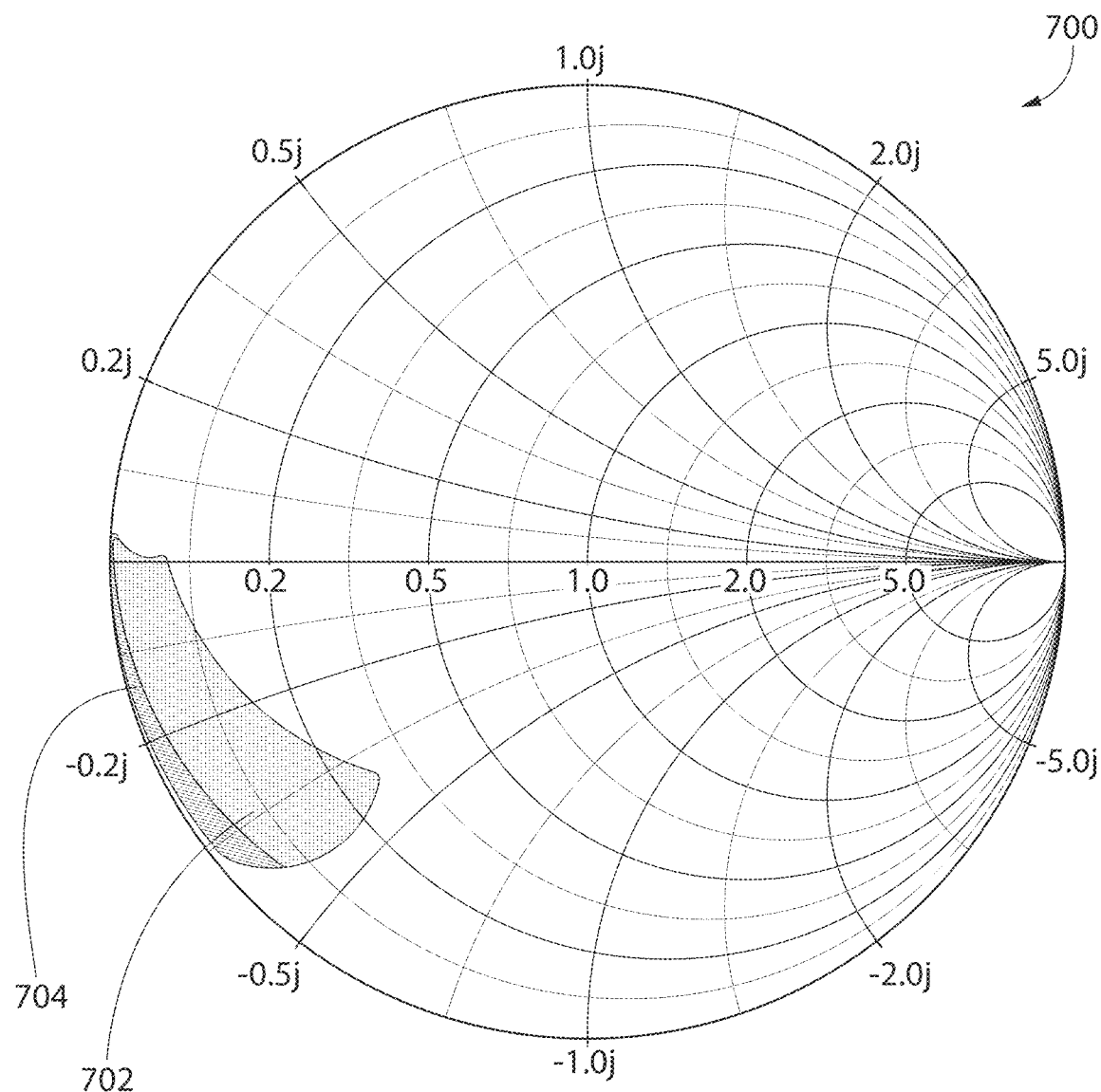
FIG. 7 is an impedance Smith chart for the pi matching network of FIG. 1 where $C3=C2_{Max}$.

FIG. 7 is an impedance Smith chart 700 where third capacitor C3 is set to the maximum capacitance of second capacitor C2 ($C3=C2_{Max}$). It is shown that the usable range of the matching network (represented by first region 702) has been increased, and the unusable range (represented by second region 704) has been decreased, without sacrificing the impedance range, using a more expensive, larger, higher voltage component, or adding more peripheral components to meet the voltage requirements.

It can also be seen, however, that the first (usable) region 702 has gaps representing areas where a perfect impedance match is not provided. This can be a result of adding capacitor C3 to reduce the voltage, which increases the gap between the quantized states of the variable capacitor when approaching $C2_{Min}$ and decreased the spacing when approaching $C2_{Max}$.

Figure 8:
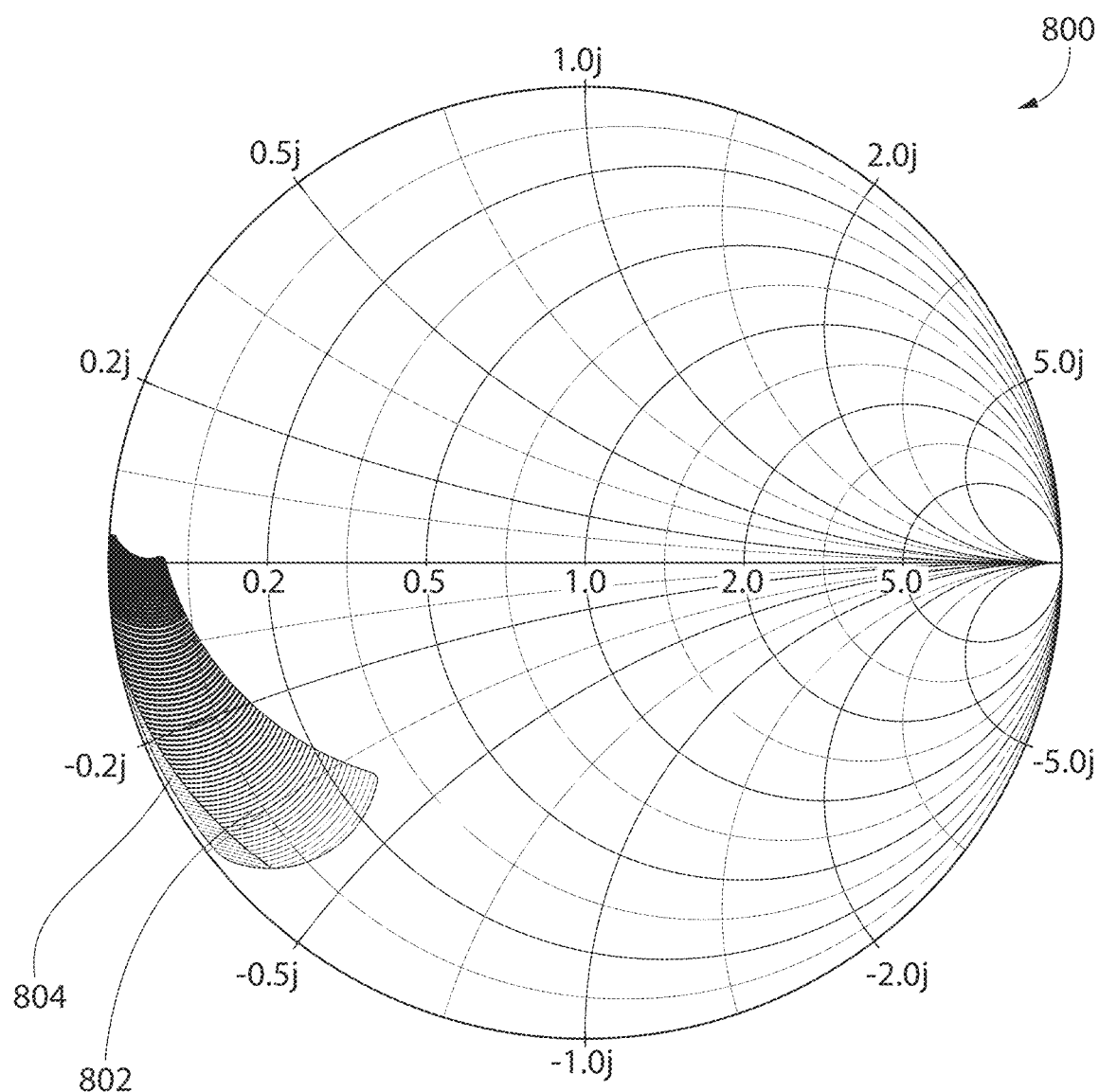
FIG. 8 is an impedance Smith chart for the pi matching network of FIG. 1 where $C3=C2_{Min}$.

FIG. 8 is an impedance Smith chart 800 where third capacitor C3 is set to the minimum capacitance of second capacitor C2 ($C3=C2_{Min}$). It is shown that such an arrangement can further increase the usable range (first region 802) of the matching network, and decrease the unusable range (second region 804). C3 can be reduced further, but there is a limit before it affects the maximum capacitance range. To avoid this, each of C3 and $C2_{Max}$ can be greater than $CVar_{Max}$. This is also true if using two or more variable capacitors in series. Thus, if C1 was replaced with C15 and C16, then $C15_{Max}$ and $C16_{Max}$ can be selected to each be greater than $C1_{Max}$. $C1_{Max}$ can be calculated using the following equation:

$$C1_{Max} = \left(\frac{1}{C15_{Max}} + \frac{1}{C16_{Max}}\right)^{-1}$$

Figure 9:
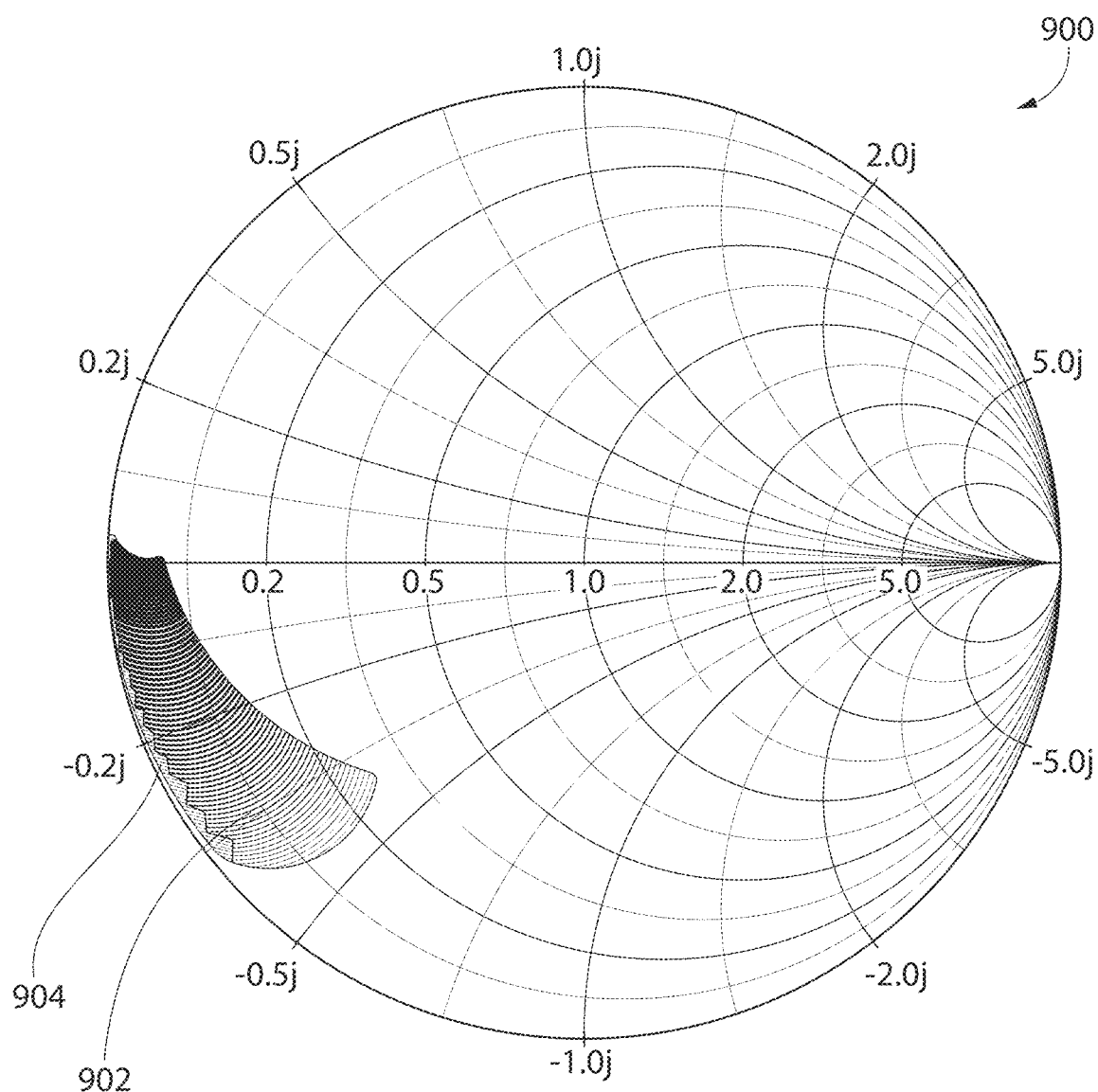
FIG. 9 is an impedance Smith chart for the pi matching network of FIG. 1 where C3 is replaced with a variable capacitor.

The addition of a third variable or non-variable capacitor, to help further reduce $V_{Drop}$, can change the capacitor range of the variable capacitor combination C2. To address this, a variable capacitor such as an EVC can be easily modified to adjust the capacitor range. The third capacitor can also change the step sizes and make them nonlinear. In certain embodiments, a more uniform distribution can be provided by using a nonlinear variable capacitor or multiple variable capacitors in series. FIG. 9 is an impedance Smith chart 900 where the third capacitor C3 is replaced with a variable capacitor. This figure shows the usable range (first region 902) of the matching network, and the unusable range (second region 904).

In other embodiments, transmission lines (which can comprise microstrips, coaxial cable, a wave guide, or any other conductive medium) can be used to rotate the impedance of the matching network on the Smith chart. The length of the transmission line at a certain frequency determines the amount of rotation. The longer the transmission line, the more rotation there will be on the Smith chart. A quarter wavelength ($\lambda/4$) transmission line (which can be calculated using the operating frequency and the property of the dielectric material) will have a 180° clockwise rotation on the Smith chart, a half wavelength ($\lambda/2$) transmission line will have a 360° clockwise rotation on the Smith chart, an eighth wavelength ($\lambda/8$) would be equal to 45°, and so on.

Figure 10:
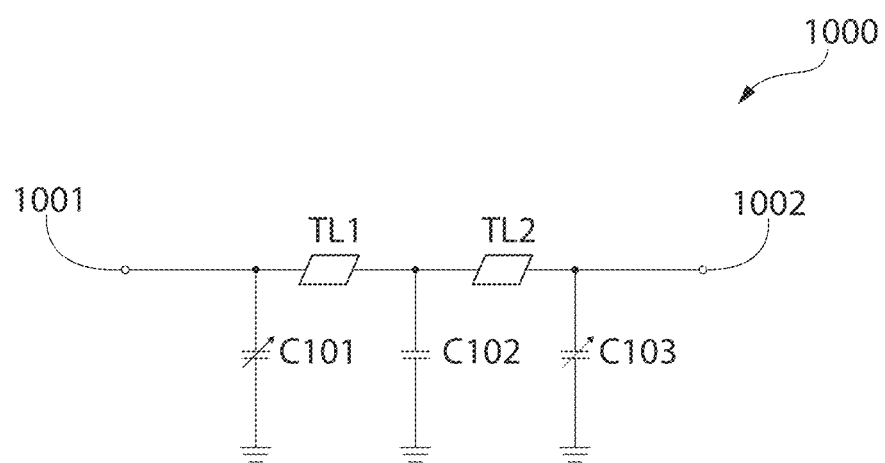
FIG. 10 is matching network using transmission lines to rotate the impedance.

If the matching network 1000 uses only quarter wave lines, or something that would ultimately give a 90° phase shift [(λ/4)+N*(λ/2)], and there are the three capacitors C101, C102, C103 in shunt (together with transmission lines TL1 and TL2), as shown in FIG. 10, the circuit can be equivalent to a low pass pi matching network, with input 1001 and output 1002. Two variable capacitors can be used with a single transmission line between to create the equivalent of an L-type matching network (e.g., C101-TL1-C102 of FIG. 10). Transmission lines can then be added to the input port, the output port or both ports to create the equivalent inverse network of the two previously mentioned matching networks. In other embodiments, other topologies can be created with other transmission lines.

Figure 11:
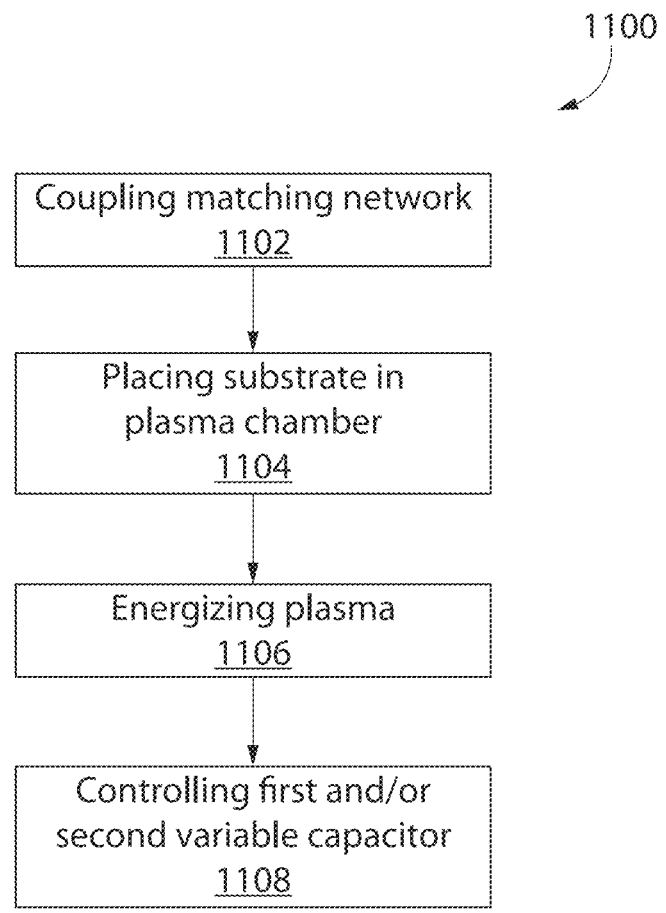
FIG. 11 is a flowchart of a method of manufacturing a semiconductor according to one embodiment.

FIG. 11 is a flowchart of a method 1100 of manufacturing a semiconductor according to one embodiment. In the exemplified embodiment, a matching network is operably coupled between an RF source and a plasma chamber (operation 1102), as in the embodiment of the system 10 shown in FIG. 1. The matching network can be configured to have the features of any of the embodiments discussed herein. Further, the method 1100 can include placing a substrate in the plasma chamber (operation 1104). Further, the method 1100 can include energizing plasma within the plasma chamber by coupling RF power from the RF source into the plasma chamber to perform a deposition or etching (operation 1106). Further, the method 1100 can include controlling a capacitance of the first variable capacitor and/or the second variable capacitor to achieve an impedance match (operation 1108).

The foregoing embodiments provide several advantages. The embodiments disclose a matching network that can more effectively handle high voltages generated in a network. Further, the embodiments avoid or minimize the need for increased component sizes (as typically required for a VVC) or increased numbers of peripheral components (as typically required with an EVC). Further, the embodiments provide a solution that has a lower cost than previous methods of addressing high voltages in a matching network. As shown herein, the embodiments can increase the usable range of a matching network without sacrificing the impedance range, using a more expensive, larger, higher voltage component, or adding more peripheral components to meet the voltage requirements.

Capacitance Variation

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of various methods for setting up an EVC or other variable capacitor to provide varying capacitances.

In an accumulative setup of an EVC, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switch in, and the fine tune capacitors are switched out. The process starts over with increasing the number of fine tune capacitors that are switched into circuit, until all fine and coarse tune capacitors are switched in. In this setup, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance.

An example of this in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system.

FIG. 12 is a graph 1 of capacitance for an accumulative EVC according to one embodiment. The graph 1 shows the capacitor percentage versus the capacitor value. In this embodiment, there are 12 coarse tune capacitors, each equal to 36 pF, and 12 fine tune capacitors, each equal to 3.3 pF. The switch is assumed to have a parasitic capacitance of 0.67 pF each. With parasitic capacitance from the switches added in series with each capacitor, the range of the EVC is 14.5 pF (all switches open) to 471.6 pF (all switches closed) and it has 169 unique capacitor values.

An alternative capacitor setup is referred to herein as a binary weighted setup. In the binary weighted setup, the capacitor values will all be different. The first value is equal to the minimum desired change in capacitance. Then each successive capacitor value is increased to double the change in capacitance from the previous up until the maximum desired capacitor value, when all capacitors are switched in.

In one example (that assumes there are no parasitic capacitances), the lowest capacitance capacitor would be a 1 pF capacitor, followed by 2 pF, 4 pF, and so on. When all switches are open, the value is 0 pF. When the 1 pF capacitor is switched in, the EVC total capacitance value is 1 pF. Then the 1 pF capacitor is switched out of circuit and the 2 pF capacitor is switched in, causing a total capacitance of 2 pF. When 3 pF is needed, the 1 pF and the 2 pF capacitors are switched in. For 4 pF, the 1 and 2 pF capacitors are switched out of circuit and the 4 pF capacitor is switched into circuit. This can be repeated adding 1 pF, 2 pF, and 4 pF together in different combinations in the circuit, creating values of 5 pF, 6 pF and 7 pF.

FIG. 13 is a graph 2 of a capacitance for a binary weighted EVC according to one embodiment. As with FIGS. 12 and 14-15, this graph 2 shows the capacitor percentage versus the capacitor value. As used herein, the term "capacitor percentage" refers to the amount of capacitance switched in as a portion of the total potential capacitance. For example, if a binary weighted system has capacitor values 1 pF, 2 pF, and 4 pF, the capacitor percentage would be 0% when all the capacitors are switched out of circuit, and 100% when all the capacitors are switched in. If the 1 pF and 4 pF capacitors are switched in, the capacitor percentage would be 5 pF/7 pF, or 71.4%.

In the embodiment of FIG. 13, the capacitors from lowest to highest value are 3.0 pF, 5.1 pF, 9.1 pF, 18 pF, 36 pF, 75 pF, 150 pF and 300 pF. Again, the switch is assumed to have a parasitic capacitance of 0.67 pF each. With parasitic capacitance from the switches added in series with each capacitor, the capacitors provide a change in capacitance from switch open to switch closed, of 2.45 pF, 4.51 pF, 8.48 pF, 17.4 pF, 35.3 pF, 74.3 pF, 149 pF and 299 pF. The EVC capacitor ranges from 5.04 pF to 596.2 pF, with 256 unique capacitor values.

The binary weighted setup can result in using far less capacitors to switch in and out of circuit to achieve the same or better resolution and range. A potential problem with this setup, however, is that, once the capacitor reaches a certain value, the voltage and/or current on that particular capacitor or the current on the switch can be higher than the specification allows for. This forces the EVC to use multiple capacitors in parallel for each switch of lower value.

FIG. 14 is a graph 3 of current versus current rating according to one embodiment. This graph 3 shows the current 3A against the current ratings 3B of a certain group of capacitors. The increase in current 3A versus the current rating 3B is not proportional and only gets worse as the capacitor value is increased. The capacitors up to 36 pF meet the specification, while the values above do not. In the accumulated method there are no issues, but in the binary weighted method it is better to instead use two 36 pF capacitors in parallel rather than one 75 pF capacitor.

Another potential disadvantage of the binary weighted setup is that it is difficult to achieve a consistent step size throughout the range. The above capacitor values for the binary setup give an average step size of 2.32 pF, compared to the accumulative method, which has an average step size of 2.72 pF. But the minimum and maximum step for the binary weighted setup is 1.51 pF and 7.51 pF, respectively, while the accumulative setup's minimum and maximum are only 2.4 pF and 2.75 pF.

With higher value capacitors, this can be further complicated with finding a value that does not overshoot multiple steps. Also, part-to-part tolerances being greater than the minimum step size can further increase the gaps. A 300 pF capacitor with a ±5% tolerance can have up to 15 pF of extra capacitance. The delta capacitance of the three least significant binary weighted capacitors total 15.44 pF. So, these values are completely overstepped, and linearity is lost.

One modification to the binary weighted setup is to have the larger capacitor values rounded down to the next standard value, for example 3.0 pF, 5.1 pF, 9.1 pF, 18 pF, 36 pF, 68 pF, 130 pF, 240 pF. Doing this would create some overlap in capacitor value where there would be a drop in capacitance when switching in the new larger value and switching out the previous smaller values. For example, the values 3 pF through 36 pF would combine to equal 71.2 pF, but the next step is 68 pF, a drop of 3.2 pF. This problem can be avoided, however, because the EVC does not need to go sequentially through each step, but instead can use software to lookup the next known capacitor position to switch to it directly.

FIG. 15 is a graph 4 of a capacitance for a binary with overlap EVC according to one embodiment. As can be observed, this graph 4 shows how the overlap helps create a smooth increase in capacitance.

Figure 16:
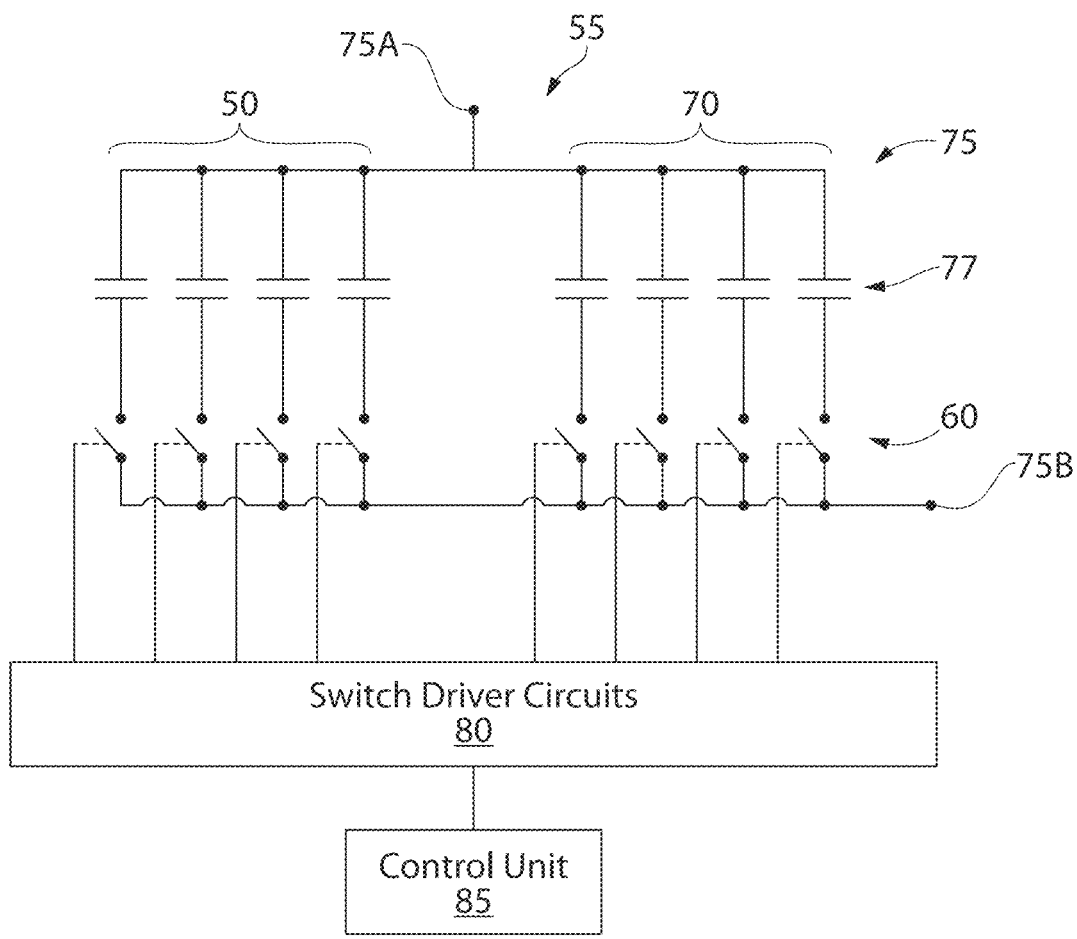
FIG. 16 is a schematic of a variable capacitance system according to one embodiment.

FIG. 16 is a schematic of a variable capacitance system 55 according to a partial binary setup. The partial binary setup uses attributes of both the accumulative and binary setups. The variable capacitance system 55 comprises a variable capacitor 75 (such as an EVC or a VVC) for providing a varying capacitance. The variable capacitor 75 has an input 75A and an output 75B. The variable capacitor 75 includes a plurality of capacitors 77 operably coupled in parallel. The plurality of capacitors 77 includes first capacitors 50 and second capacitors 70. Further, the variable capacitor 75 includes a plurality of switches 60. Of the switches 60, one switch is operably coupled in series to each of the plurality of capacitors to switch in and out each capacitor, thereby enabling the variable capacitor 75 to provide varying total capacitances.

The switches 60 can be coupled to switch driver circuits 80 for driving the switches on and off. The variable capacitance system 55 can further include a control unit 85 operably coupled to the driver circuits 80 for instructing the driver circuits 80 to switch one or more of the switches 60, and thereby turn one or more of the capacitors 77 on or off. In one embodiment, the control unit 85 can form part of a control unit that controls variable capacitor, such as a control unit that instruct the variable capacitors of a matching network to change capacitances to achieve an impedance match.

In the exemplified embodiment, the first capacitors 50 are fine tune capacitors using a method similar to the binary method discussed above. Thus, the fine tune capacitors 50 can have capacitances increasing by a factor of about two, where "about two" refers to a value of 1.5 to 2.5. In an ideal example where there are no parasitic capacitances, the fine tune capacitors could increase by a factor of exactly two (e.g., 1 pF, 2 pF, 4 pF, 8 pF).

But in real world applications, parasitic capacitances, such as those provided by the switches 60, are another factor that must be considered in choosing the capacitance values of the fine tune capacitors 50. Thus, while a first capacitor may have a value of 1 pF, and the corresponding capacitor-switch pair may thus provide 1 pF to a total capacitance of the variable capacitor when the capacitor's corresponding switch is closed, when the switch is open, the open switch may have a parasitic capacitance of, for example, 1 pF. Thus, when the switch is open, there are essentially two 1 pF capacitances in series, which is equivalent to 0.5 pF. Thus, when the first fine tune capacitor switch switches from open to close, the change in the capacitance contributed to the variable capacitor by this capacitor-switch pair is from 0.5 pF (open) to 1 pF (closed), for a change of 0.5 pF. These changes in capacitance caused by parasitic capacitances must be taken into consideration in choosing capacitor values to ensure that the target step size (e.g., 0.5 pF) for the total capacitance can be achieved.

Returning to the previous example, if an EVC had four fine capacitors, and each capacitor switch had a parasitic capacitance of 1 pF, and a step size of 0.5 pF was desired, the fine capacitors could be 1 pF, 1.6 pF, 2.7 pF, and 4.7 pF. As discussed, the first fine capacitor (1 pF) would cause a 0.5 pF change to the total capacitance when switched in. The second fine tune capacitor (1.6 pF) and its switch would provide 0.6 pF when open and 1.6 pF when closed, thus causing a change in the total capacitance of about 1 pF when switched in. The third fine tune capacitor (2.7 pF) would cause a change in the total capacitance of about 2 pF when switched in, and the fourth fine tune capacitor (4.8 pF) would cause a change in the total capacitance of about 4 pF when switched in. Thus, the changes to the total capacitance caused by the switching in of each of the four first tune capacitors would be 0.5 pF, 1 pF, 2 pF, and 4 pF, respectively. Thus, the changes caused by the switching in of each of these capacitors increases by a factor of two. It is understood that the invention is not limited to these values. Other capacitor values (or switches with other parasitic capacitances) can be used such that the changes caused increase by a factor of about two. For example, the 4.8 pF capacitor of the above example could be replaced with a standard 4.7 pF capacitor. Further, other capacitance values can be used to achieve other step sizes. The foregoing considerations regarding parasitic capacitances can equally apply to the binary setup discussed above.

The second capacitors 70, by contrast, are coarse tune capacitors using a method similar to the accumulative method discussed above. Thus, the second capacitors can have a substantially similar capacitance. Capacitors are considered to have substantially similar capacitances if, of the capacitors in question, no capacitance is 15 percent (15%) greater than or less than another capacitance. Alternatively, the capacitors can be chosen such that there are no gaps in total capacitance greater than the minimum step size needed for the given application.

The first (fine) capacitors 50 can increase their value (or the value by which they change the total capacitance) in a binary fashion, and thus by a factor of about two, up to the first coarse position. When all of the fine capacitors 50 are switched into circuit, the first coarse capacitor 71 can be switched in, and all the fine capacitors 50 are switched out. Then the fine capacitors 50 can be switched in and out until they are all switched into circuit. The next step would be to add another coarse tune capacitor 72. It is understood, however, that the EVC does not need to go sequentially through each step to achieve a desired total capacitance, but instead can use software to lookup the next known capacitor position to switch to it directly.

In one embodiment, there are four fine capacitors 50. The first fine capacitor 51 has a capacitance of 3.0 pF, the second fine capacitor 52 has a capacitance of 5.1 pF, the third fine capacitor 53 has a capacitance of 9.1 pF, and the fourth fine capacitor has a capacitance of 18 pF. Further, there are four coarse tune capacitors 70 having capacitances of 36 pF each. Thus, in this embodiment, the total combined capacitance of the fine capacitors (35.2 pF) is substantially similar to the individual capacitances of the coarse capacitors (36 pF). It also follows that the capacitance of each of the coarse capacitors is greater than a greatest individual capacitance (18 pF) of the fine capacitors.

In this embodiment, there will be 208 unique capacitor values. With parasitics, the minimum total capacitance is 10.25 pF and the maximum total capacitance is 467.2 pF. The range is less than 1 pF less than the accumulative method, but with an increase in unique points. The minimum step size is 1.51 pF, the maximum is 2.54 pF and the average is 2.21 pF. Thus, the results of the setups discussed are as follows:

TABLE 1

Comparison of EVC Setups

| | Accumulative | Binary Weighted | Partial Binary |
|---|---|---|---|
| Min total capacitance | 14.5 pF | 5.05 pF | 10.25 pF |
| Max total capacitance | 471.6 pF | 596.2 pF | 467.2 pF |
| Min and max step size | 2.4-2.75 pF | 1.51-7.51 pF | 1.51-2.54 pF |
| Unique capacitor values | 169 | 256 | 208 |

Figure 17:
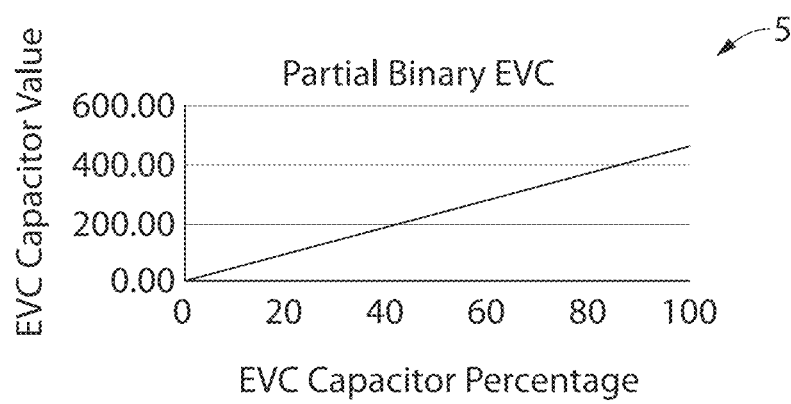
FIG. 17 is a graph of a capacitance of a partial binary EVC according to one embodiment.

FIG. 17 is a graph 5 of a capacitance of a partial binary EVC according to one embodiment. The graph shows the capacitor percentage versus the EVC total capacitance for the partial binary method for switching. As can be seen, this setup provides a smooth line for providing the various total capacitances required while also providing a large range.

The partial binary method provides multiple advantages. First, the current on each capacitor will not be over its rating. The maximum current and the current rating will be the same for all coarse capacitors, because they will be the same value. With the fine steps, all of the capacitor values have a higher ratio of current rating to maximum current. Therefore, no issues should arise.

Further, the partial binary approach avoids large gaps in capacitance steps. Further, less capacitors are needed to have the same range, while the number of unique values can potentially be increased. With less capacitors, the EVC will need less switches, causing the EVC to take up less area. Further, less capacitors will require less hardware to control the switches.

Binary with overlap can also be implemented in this setup to avoid any issues with part tolerance if required. Thus, the coarse capacitor values could be reduced in capacitance. It is further understood that, while the exemplified embodiment uses four first capacitors 50 and four second capacitors 70, other numbers of capacitors can be used. Also, other capacitor values can be used.

Figure 18:
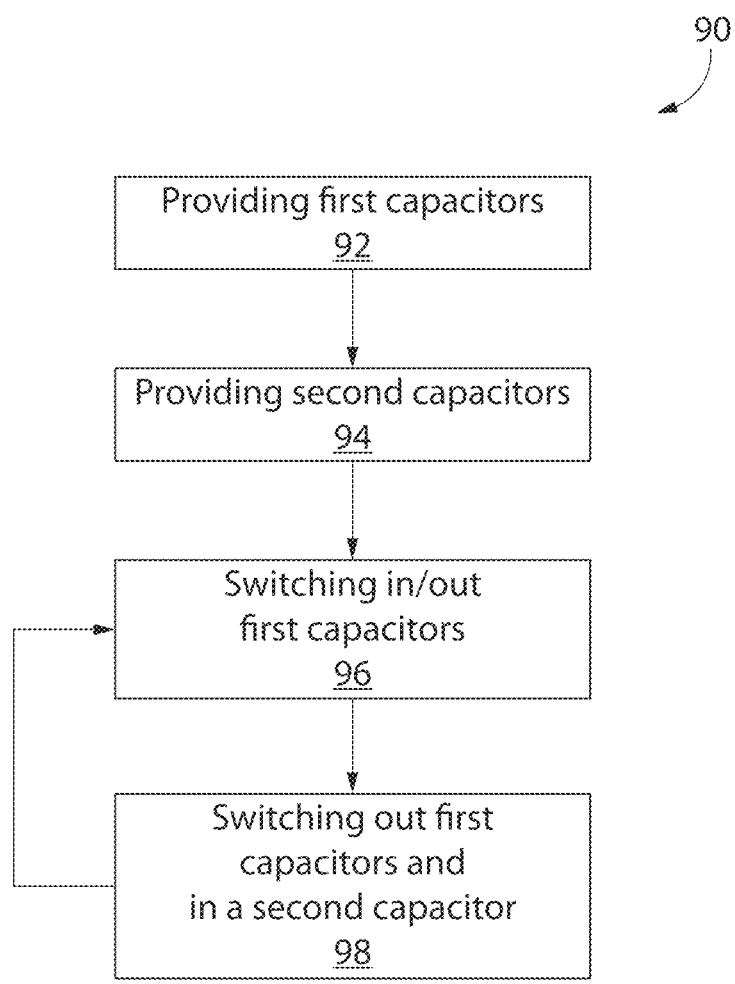
FIG. 18 is a flow chart of a method for varying capacitance according to one embodiment.

FIG. 18 is a flow chart of a method for varying capacitance according to one embodiment. According to this embodiment, there is provided a plurality of capacitors operably coupled in parallel, the plurality of capacitors comprising first capacitors increasing in capacitance by a factor of about two (operation 92); and second capacitors having substantially the same capacitance (operation 94). The total capacitance can be varied by switching in or out one of the first capacitors and one of the second capacitors. Increasing total capacitance can be provided by switching in and out each of the first capacitors to provide an increasing total capacitance until all of the first capacitors are switched in (operation 96), then switching out the first capacitors and switching in a second capacitor (operation 98). If increasing total capacitance is desired, the system can again switch in and out each of the first capacitors to provide an increasing total capacitance until all of the first capacitors are switched in (operation 98).

It is understood, however, that the EVC does not need to go sequentially through each step, but instead can use software to lookup the next known capacitor position to switch to it directly. It is further understood that a desired total capacitance can be achieved by having switched on a minimal number of capacitors of the plurality of capacitors.

In another embodiment, the variable capacitor can for part of a method of manufacturing a semiconductor, such as the system displayed shown in FIG. 1. The method can include operably coupling a matching network between an RF source and a plasma chamber, the plasma chamber configured to deposit a material layer onto the substrate or etch a material layer from the substrate. The matching network can include an input configured to operably couple to the RF source; an output configured to operably couple to the plasma chamber; and a variable capacitor, the variable capacitor comprising a plurality of capacitors operably coupled in parallel, the plurality of capacitors comprising first capacitors increasing in capacitance by a factor of about two; and second capacitors having substantially the same capacitance. The method can further include the steps of placing a substrate in the plasma chamber; energizing plasma within the plasma chamber by coupling RF power from the RF source into the plasma chamber to perform a deposition or etching; and controlling a total capacitance of the variable capacitor to achieve an impedance match, the total capacitance being controlled by switching in and out capacitors of the plurality of capacitors.

Restricted Partial Binary Capacitor Switching

Figure 18A:
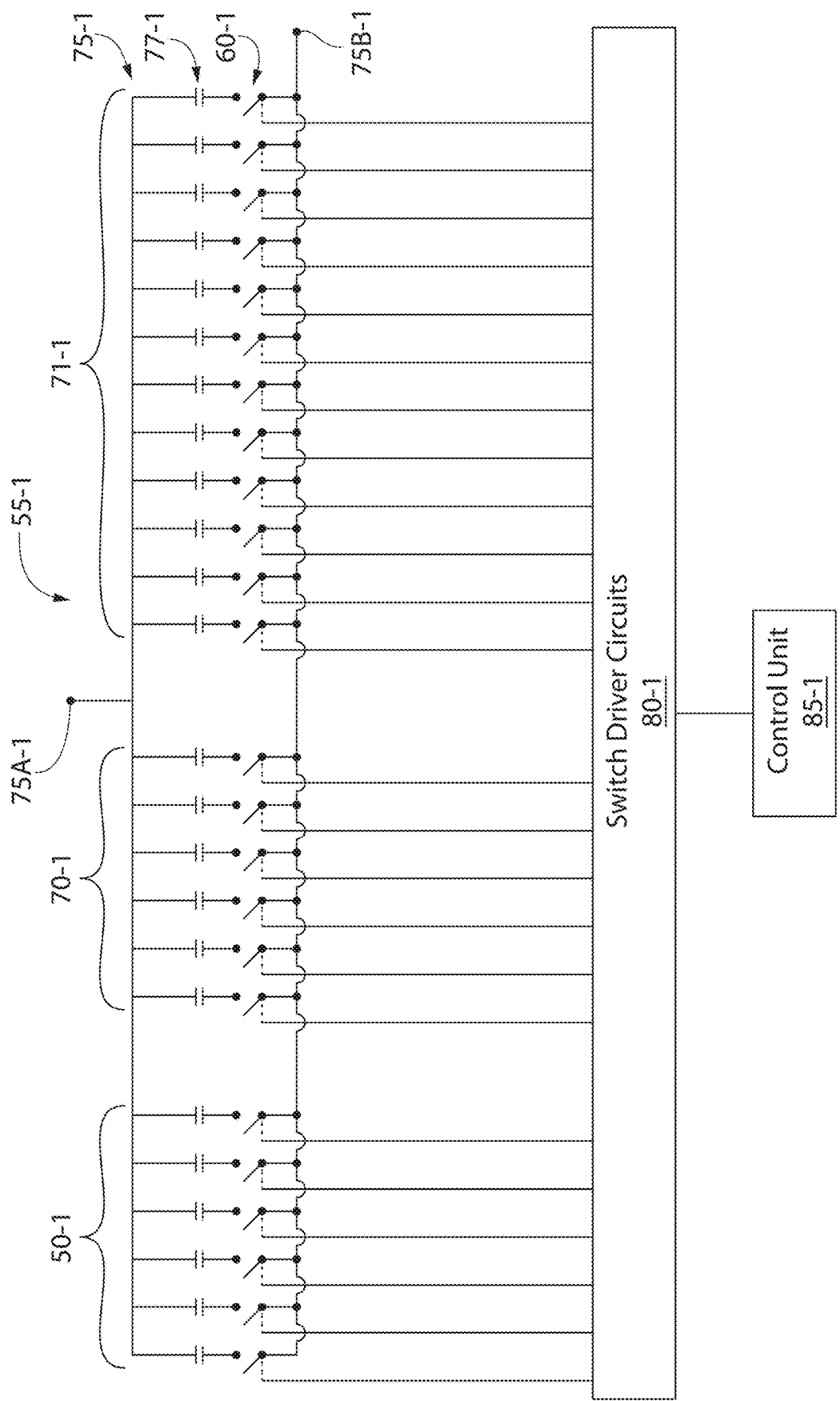
FIG. 18A is a schematic of a restricted partial binary variable capacitance system according to one embodiment.

FIG. 18A is a schematic of a restricted partial binary variable capacitance system 55-1 according to one embodiment. This method uses a partial binary setup similar to that discussed above, but where one or more fine capacitors are restricted from switching in under certain circumstances to be described below ("restricted partial binary setup"). The variable capacitance system 55-1 comprises a variable capacitor 75-1 (such as an EVC) for providing a varying capacitance. The variable capacitor 75-1 has an input 75A-1 and an output 75B-1. The variable capacitor 75-1 includes a plurality of capacitors 77-1 operably coupled in parallel. The plurality of capacitors 77-1 includes fine capacitors 50-1, first coarse capacitors 70-1, and second coarse capacitors 71-1. Further, the variable capacitor 75-1 includes a plurality of switches 60-1. Of the switches 60-1, one switch is operably coupled in series to each of the plurality of capacitors to switch in and out each capacitor, thereby enabling the variable capacitor 75-1 to provide varying total capacitances.

The switches 60-1 can be coupled to switch driver circuits 80-1 for driving the switches on and off. The variable capacitance system 55-1 can further include a control unit 85-1 operably coupled to the driver circuits 80-1 for instructing the driver circuits 80-1 to switch one or more of the switches 60-1, and thereby turn one or more of the capacitors 77-1 on or off. In one embodiment, the control unit 85-1 can form part of a control unit for a matching network that controls the capacitances of one or more variable capacitors of the matching network to achieve an impedance match. In the exemplified embodiment, the control unit 85-1 (sometimes referred to as "control circuit") is configured to (a) determine which of the coarse capacitors and the fine capacitors to have switched in to achieve an impedance match and (b) cause the determined coarse and fine capacitors to be switched in. This can be based on a determination, by the control unit or otherwise, of the variable impedance of the plasma chamber. The invention is not so limited, however, as the determination of the capacitors to switch in can be based on other factors, such as an input impedance at the input of the matching network.

In the exemplified embodiment, the fine capacitors 50-1 have capacitances increasing by a factor of about two, where "about two" refers to a value of 1.5 to 2.5, though the invention is not so limited and the fine capacitors can increase in value in another manner. In an ideal example where there are no parasitic capacitances, the fine tune capacitors could increase by a factor of exactly two (e.g., 1 pF, 2 pF, 4 pF, 8 pF, etc.). But as discussed above, in real world applications parasitic capacitances, such as those provided by the switches 60-1, are another factor that must be considered in choosing the capacitance values of the fine tune capacitors 50-1. In the exemplified embodiment, the fine capacitors 50-1 have values of 47 pF, 91 pF, 180 pF, 390 pF, 750 pF, 1500 pF, though the invention is not limited to these values or this number of capacitors.

According to the restricted partial binary setup, the coarse capacitors are made up of first coarse capacitors 70-1 each having a substantially similar first coarse capacitance, and second coarse capacitors 71-1 each having a substantially similar second coarse capacitance. Capacitors are considered to have substantially similar capacitances if, of the capacitors in question, no capacitance is 15 percent (15%) greater than or less than another capacitance. In the exemplified embodiment, there are 6 first coarse capacitors 70-1 each having a capacitance of 1000 pF, and 12 second coarse capacitors 71-1 each having a capacitance of 3000 pF. Thus, in the exemplified embodiment, one of the fine capacitors (the 1500 pF fine capacitor) has a capacitance greater than the first coarse capacitance of 1000 pF. In other embodiments, more than one of the fine capacitors can have a capacitance greater than the first coarse capacitance. Further, in other embodiments other values and other numbers of coarse capacitors can be used.

Each capacitor of the plurality of capacitors 77-1 provides a change to a total capacitance of the variable capacitor 75-1 when the capacitor is switched in. To gradually increase the total capacitance of the variable capacitor 75-1, the control unit 85-1 can successively switch in, in a predetermined order, each of the first coarse capacitors 70-1, followed by each of the second coarse capacitors 71-1. As for the fine capacitors 50-1, the control unit restricts which fine capacitors can be switched in. That is, it only switches in the fine capacitors 50-1 whose capacitance is less than a capacitance of a next coarse capacitor of the coarse capacitors predetermined to be switched in next.

As discussed above, in the exemplified embodiment, the fine capacitors 50-1 have capacitances substantially equal to 47 pF, 91 pF, 180 pF, 390 pF, 750 pF, 1500 pF; the first coarse capacitors 70-1 comprise six capacitors having capacitances substantially equal to 1000 pF; and the second coarse capacitors 71-1 comprise twelve capacitors having capacitances substantially equal to 3000 pF. To gradually increase capacitance, the fine capacitors can be switched into the circuit in a binary fashion as described above except for the 1500 pF fine capacitor, which is restricted from switching in until all the first coarse capacitors are switched in. When all the 1000 pF first coarse capacitors are switched in, the next coarse capacitor to be switched in is a 3000 pF second coarse capacitor. Thus, once all the 1000 pF first coarse capacitors are switched in, the 1500 pF fine capacitor is able to switch in with the rest of the fine capacitors.

Table 3 below shows the first 167 positions ("Pos.") for a variable capacitor using the restricted partial binary setup. The total capacitance ("Total Cap.") for each position is shown, along with the fine capacitors (F1-F6) and first coarse capacitors (C1-C6) switched in for a given position. As can be seen, although the fine capacitors switch in in a somewhat typical binary fashion, the 1500 pF fine capacitor is not able to switch in until position 165, when all of the first coarse capacitors have been switched in.

TABLE 3

| | | | | | | Restricted Partial Binary Values | | | | | | | |
|---|---|---|---|---|---|---|---|---|---|---|---|---|---|
| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
| 1 | 0 | | | | | | | | | | | | |
| 2 | 47 | 47 | | | | | | | | | | | | |
| 3 | 91 | | 91 | | | | | | | | | | | |
| 4 | 138 | 47 | 91 | | | | | | | | | | | |

TABLE 3-continued

Restricted Partial Binary Values

| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
|---|---|---|---|---|---|---|---|---|---|---|---|---|---|
| 5 | 180 | | | 180 | | | | | | | | | |
| 6 | 227 | 47 | | 180 | | | | | | | | | |
| 7 | 271 | | 91 | 180 | | | | | | | | | |
| 8 | 318 | 47 | 91 | 180 | | | | | | | | | |
| 9 | 390 | | | | 390 | | | | | | | | |
| 10 | 437 | 47 | | | 390 | | | | | | | | |
| 11 | 481 | | 91 | | 390 | | | | | | | | |
| 12 | 528 | 47 | 91 | | 390 | | | | | | | | |
| 13 | 570 | | | 180 | 390 | | | | | | | | |
| 14 | 617 | 47 | | 180 | 390 | | | | | | | | |
| 15 | 661 | | 91 | 180 | 390 | | | | | | | | |
| 16 | 708 | 47 | 91 | 180 | 390 | | | | | | | | |
| 17 | 750 | | | | | 750 | | | | | | | |
| 18 | 797 | 47 | | | | 750 | | | | | | | |
| 19 | 841 | | 91 | | | 750 | | | | | | | |
| 20 | 888 | 47 | 91 | | | 750 | | | | | | | |
| 21 | 930 | | | 180 | | 750 | | | | | | | |
| 22 | 977 | 47 | | 180 | | 750 | | | | | | | |
| 23 | 1000 | | | | | | | 1000 | | | | | |
| 24 | 1047 | 47 | | | | | | 1000 | | | | | |
| 25 | 1091 | | 91 | | | | | 1000 | | | | | |
| 26 | 1138 | 47 | 91 | | | | | 1000 | | | | | |
| 27 | 1180 | | | 180 | | | | 1000 | | | | | |
| 28 | 1227 | 47 | | 180 | | | | 1000 | | | | | |
| 29 | 1271 | | 91 | 180 | | | | 1000 | | | | | |
| 30 | 1318 | 47 | 91 | 180 | | | | 1000 | | | | | |
| 31 | 1390 | | | | 390 | | | 1000 | | | | | |
| 32 | 1437 | 47 | | | 390 | | | 1000 | | | | | |
| 33 | 1481 | | 91 | | 390 | | | 1000 | | | | | |
| 34 | 1528 | 47 | 91 | | 390 | | | 1000 | | | | | |
| 35 | 1570 | | | 180 | 390 | | | 1000 | | | | | |
| 36 | 1617 | 47 | | 180 | 390 | | | 1000 | | | | | |
| 37 | 1661 | | 91 | 180 | 390 | | | 1000 | | | | | |
| 38 | 1708 | 47 | 91 | 180 | 390 | | | 1000 | | | | | |
| 39 | 1750 | | | | | 750 | | 1000 | | | | | |
| 40 | 1797 | 47 | | | | 750 | | 1000 | | | | | |
| 41 | 1841 | | 91 | | | 750 | | 1000 | | | | | |
| 42 | 1888 | 47 | 91 | | | 750 | | 1000 | | | | | |
| 43 | 1930 | | | 180 | | 750 | | 1000 | | | | | |
| 44 | 1977 | 47 | | 180 | | 750 | | 1000 | | | | | |
| 45 | 2000 | | | | | | | 1000 | 1000 | | | | |
| 46 | 2047 | 47 | | | | | | 1000 | 1000 | | | | |
| 47 | 2091 | | 91 | | | | | 1000 | 1000 | | | | |
| 48 | 2138 | 47 | 91 | | | | | 1000 | 1000 | | | | |
| 49 | 2180 | | | 180 | | | | 1000 | 1000 | | | | |
| 50 | 2227 | 47 | | 180 | | | | 1000 | 1000 | | | | |
| 51 | 2271 | | 91 | 180 | | | | 1000 | 1000 | | | | |
| 52 | 2318 | 47 | 91 | 180 | | | | 1000 | 1000 | | | | |
| 53 | 2390 | | | | 390 | | | 1000 | 1000 | | | | |
| 54 | 2437 | 47 | | | 390 | | | 1000 | 1000 | | | | |
| 55 | 2481 | | 91 | | 390 | | | 1000 | 1000 | | | | |
| 56 | 2528 | 47 | 91 | | 390 | | | 1000 | 1000 | | | | |
| 57 | 2570 | | | 180 | 390 | | | 1000 | 1000 | | | | |
| 58 | 2617 | 47 | | 180 | 390 | | | 1000 | 1000 | | | | |
| 59 | 2661 | | 91 | 180 | 390 | | | 1000 | 1000 | | | | |
| 60 | 2708 | 47 | 91 | 180 | 390 | | | 1000 | 1000 | | | | |
| 61 | 2750 | | | | | 750 | | 1000 | 1000 | | | | |
| 62 | 2797 | 47 | | | | 750 | | 1000 | 1000 | | | | |
| 63 | 2841 | | 91 | | | 750 | | 1000 | 1000 | | | | |
| 64 | 2888 | 47 | 91 | | | 750 | | 1000 | 1000 | | | | |
| 65 | 2930 | | | 180 | | 750 | | 1000 | 1000 | | | | |
| 66 | 2977 | 47 | | 180 | | 750 | | 1000 | 1000 | | | | |
| 67 | 3000 | | | | | | | 1000 | 1000 | 1000 | | | |
| 68 | 3047 | 47 | | | | | | 1000 | 1000 | 1000 | | | |
| 69 | 3091 | | 91 | | | | | 1000 | 1000 | 1000 | | | |
| 70 | 3138 | 47 | 91 | | | | | 1000 | 1000 | 1000 | | | |
| 71 | 3180 | | | 180 | | | | 1000 | 1000 | 1000 | | | |
| 72 | 3227 | 47 | | 180 | | | | 1000 | 1000 | 1000 | | | |
| 73 | 3271 | | 91 | 180 | | | | 1000 | 1000 | 1000 | | | |
| 74 | 3318 | 47 | 91 | 180 | | | | 1000 | 1000 | 1000 | | | |
| 75 | 3390 | | | | 390 | | | 1000 | 1000 | 1000 | | | |
| 76 | 3437 | 47 | | | 390 | | | 1000 | 1000 | 1000 | | | |
| 77 | 3481 | | 91 | | 390 | | | 1000 | 1000 | 1000 | | | |
| 78 | 3528 | 47 | 91 | | 390 | | | 1000 | 1000 | 1000 | | | |
| 79 | 3570 | | | 180 | 390 | | | 1000 | 1000 | 1000 | | | |

TABLE 3-continued

Restricted Partial Binary Values

| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
|---|---|---|---|---|---|---|---|---|---|---|---|---|---|
| 80 | 3617 | 47 | | 180 | 390 | | | 1000 | 1000 | 1000 | | | |
| 81 | 3661 | | 91 | 180 | 390 | | | 1000 | 1000 | 1000 | | | |
| 82 | 3708 | 47 | 91 | 180 | 390 | | | 1000 | 1000 | 1000 | | | |
| 83 | 3750 | | | | | 750 | | 1000 | 1000 | 1000 | | | |
| 84 | 3797 | 47 | | | | 750 | | 1000 | 1000 | 1000 | | | |
| 85 | 3841 | | 91 | | | 750 | | 1000 | 1000 | 1000 | | | |
| 86 | 3888 | 47 | 91 | | | 750 | | 1000 | 1000 | 1000 | | | |
| 87 | 3930 | | | 180 | | 750 | | 1000 | 1000 | 1000 | | | |
| 88 | 3977 | 47 | | 180 | | 750 | | 1000 | 1000 | 1000 | | | |
| 89 | 4000 | | | | | | | 1000 | 1000 | 1000 | 1000 | | |
| 90 | 4047 | 47 | | | | | | 1000 | 1000 | 1000 | 1000 | | |
| 91 | 4091 | | 91 | | | | | 1000 | 1000 | 1000 | 1000 | | |
| 92 | 4138 | 47 | 91 | | | | | 1000 | 1000 | 1000 | 1000 | | |
| 93 | 4180 | | | 180 | | | | 1000 | 1000 | 1000 | 1000 | | |
| 94 | 4227 | 47 | | 180 | | | | 1000 | 1000 | 1000 | 1000 | | |
| 95 | 4271 | | 91 | 180 | | | | 1000 | 1000 | 1000 | 1000 | | |
| 96 | 4318 | 47 | 91 | 180 | | | | 1000 | 1000 | 1000 | 1000 | | |
| 97 | 4390 | | | | 390 | | | 1000 | 1000 | 1000 | 1000 | | |
| 98 | 4437 | 47 | | | 390 | | | 1000 | 1000 | 1000 | 1000 | | |
| 99 | 4481 | | 91 | | 390 | | | 1000 | 1000 | 1000 | 1000 | | |
| 100 | 4528 | 47 | 91 | | 390 | | | 1000 | 1000 | 1000 | 1000 | | |
| 101 | 4570 | | | 180 | 390 | | | 1000 | 1000 | 1000 | 1000 | | |
| 102 | 4617 | 47 | | 180 | 390 | | | 1000 | 1000 | 1000 | 1000 | | |
| 103 | 4661 | | 91 | 180 | 390 | | | 1000 | 1000 | 1000 | 1000 | | |
| 104 | 4708 | 47 | 91 | 180 | 390 | | | 1000 | 1000 | 1000 | 1000 | | |
| 105 | 4750 | | | | | 750 | | 1000 | 1000 | 1000 | 1000 | | |
| 106 | 4797 | 47 | | | | 750 | | 1000 | 1000 | 1000 | 1000 | | |
| 107 | 4841 | | 91 | | | 750 | | 1000 | 1000 | 1000 | 1000 | | |
| 108 | 4888 | 47 | 91 | | | 750 | | 1000 | 1000 | 1000 | 1000 | | |
| 109 | 4930 | | | 180 | | 750 | | 1000 | 1000 | 1000 | 1000 | | |
| 110 | 4977 | 47 | | 180 | | 750 | | 1000 | 1000 | 1000 | 1000 | | |
| 111 | 5000 | | | | | | | 1000 | 1000 | 1000 | 1000 | 1000 | |
| 112 | 5047 | 47 | | | | | | 1000 | 1000 | 1000 | 1000 | 1000 | |
| 113 | 5091 | | 91 | | | | | 1000 | 1000 | 1000 | 1000 | 1000 | |
| 114 | 5138 | 47 | 91 | | | | | 1000 | 1000 | 1000 | 1000 | 1000 | |
| 115 | 5180 | | | 180 | | | | 1000 | 1000 | 1000 | 1000 | 1000 | |
| 116 | 5227 | 47 | | 180 | | | | 1000 | 1000 | 1000 | 1000 | 1000 | |
| 117 | 5271 | | 91 | 180 | | | | 1000 | 1000 | 1000 | 1000 | 1000 | |
| 118 | 5318 | 47 | 91 | 180 | | | | 1000 | 1000 | 1000 | 1000 | 1000 | |
| 119 | 5390 | | | | 390 | | | 1000 | 1000 | 1000 | 1000 | 1000 | |
| 120 | 5437 | 47 | | | 390 | | | 1000 | 1000 | 1000 | 1000 | 1000 | |
| 121 | 5481 | | 91 | | 390 | | | 1000 | 1000 | 1000 | 1000 | 1000 | |
| 122 | 5528 | 47 | 91 | | 390 | | | 1000 | 1000 | 1000 | 1000 | 1000 | |
| 123 | 5570 | | | 180 | 390 | | | 1000 | 1000 | 1000 | 1000 | 1000 | |
| 124 | 5617 | 47 | | 180 | 390 | | | 1000 | 1000 | 1000 | 1000 | 1000 | |
| 125 | 5661 | | 91 | 180 | 390 | | | 1000 | 1000 | 1000 | 1000 | 1000 | |
| 126 | 5708 | 47 | 91 | 180 | 390 | | | 1000 | 1000 | 1000 | 1000 | 1000 | |
| 127 | 5750 | | | | | 750 | | 1000 | 1000 | 1000 | 1000 | 1000 | |
| 128 | 5797 | 47 | | | | 750 | | 1000 | 1000 | 1000 | 1000 | 1000 | |
| 129 | 5841 | | 91 | | | 750 | | 1000 | 1000 | 1000 | 1000 | 1000 | |
| 130 | 5888 | 47 | 91 | | | 750 | | 1000 | 1000 | 1000 | 1000 | 1000 | |
| 131 | 5930 | | | 180 | | 750 | | 1000 | 1000 | 1000 | 1000 | 1000 | |
| 132 | 5977 | 47 | | 180 | | 750 | | 1000 | 1000 | 1000 | 1000 | 1000 | |
| 133 | 6000 | | | | | | | 1000 | 1000 | 1000 | 1000 | 1000 | 1000 |
| 134 | 6047 | 47 | | | | | | 1000 | 1000 | 1000 | 1000 | 1000 | 1000 |
| 135 | 6091 | | 91 | | | | | 1000 | 1000 | 1000 | 1000 | 1000 | 1000 |
| 136 | 6138 | 47 | 91 | | | | | 1000 | 1000 | 1000 | 1000 | 1000 | 1000 |
| 137 | 6180 | | | 180 | | | | 1000 | 1000 | 1000 | 1000 | 1000 | 1000 |
| 138 | 6227 | 47 | | 180 | | | | 1000 | 1000 | 1000 | 1000 | 1000 | 1000 |
| 139 | 6271 | | 91 | 180 | | | | 1000 | 1000 | 1000 | 1000 | 1000 | 1000 |
| 140 | 6318 | 47 | 91 | 180 | | | | 1000 | 1000 | 1000 | 1000 | 1000 | 1000 |
| 141 | 6390 | | | | 390 | | | 1000 | 1000 | 1000 | 1000 | 1000 | 1000 |
| 142 | 6437 | 47 | | | 390 | | | 1000 | 1000 | 1000 | 1000 | 1000 | 1000 |
| 143 | 6481 | | 91 | | 390 | | | 1000 | 1000 | 1000 | 1000 | 1000 | 1000 |
| 144 | 6528 | 47 | 91 | | 390 | | | 1000 | 1000 | 1000 | 1000 | 1000 | 1000 |
| 145 | 6570 | | | 180 | 390 | | | 1000 | 1000 | 1000 | 1000 | 1000 | 1000 |
| 146 | 6617 | 47 | | 180 | 390 | | | 1000 | 1000 | 1000 | 1000 | 1000 | 1000 |
| 147 | 6661 | | 91 | 180 | 390 | | | 1000 | 1000 | 1000 | 1000 | 1000 | 1000 |
| 148 | 6708 | 47 | 91 | 180 | 390 | | | 1000 | 1000 | 1000 | 1000 | 1000 | 1000 |
| 149 | 6750 | | | | | 750 | | 1000 | 1000 | 1000 | 1000 | 1000 | 1000 |
| 150 | 6797 | 47 | | | | 750 | | 1000 | 1000 | 1000 | 1000 | 1000 | 1000 |
| 151 | 6841 | | 91 | | | 750 | | 1000 | 1000 | 1000 | 1000 | 1000 | 1000 |
| 152 | 6888 | 47 | 91 | | | 750 | | 1000 | 1000 | 1000 | 1000 | 1000 | 1000 |
| 153 | 6930 | | | 180 | | 750 | | 1000 | 1000 | 1000 | 1000 | 1000 | 1000 |
| 154 | 6977 | 47 | | 180 | | 750 | | 1000 | 1000 | 1000 | 1000 | 1000 | 1000 |

TABLE 3-continued

Restricted Partial Binary Values

| Pos. | Total Cap. | F1 (47) | F2 (91) | F3 (180) | F4 (390) | F5 (750) | F6 (1500) | C1 (1000) | C2 (1000) | C3 (1000) | C4 (1000) | C5 (1000) | C6 (1000) |
|---|---|---|---|---|---|---|---|---|---|---|---|---|---|
| 155 | 7021 |    | 91 | 180 |     | 750 |      | 1000 | 1000 | 1000 | 1000 | 1000 | 1000 |
| 156 | 7068 | 47 | 91 | 180 |     | 750 |      | 1000 | 1000 | 1000 | 1000 | 1000 | 1000 |
| 157 | 7140 |    |    |     | 390 | 750 |      | 1000 | 1000 | 1000 | 1000 | 1000 | 1000 |
| 158 | 7187 | 47 |    |     | 390 | 750 |      | 1000 | 1000 | 1000 | 1000 | 1000 | 1000 |
| 159 | 7231 |    | 91 |     | 390 | 750 |      | 1000 | 1000 | 1000 | 1000 | 1000 | 1000 |
| 160 | 7278 | 47 | 91 |     | 390 | 750 |      | 1000 | 1000 | 1000 | 1000 | 1000 | 1000 |
| 161 | 7320 |    |    | 180 | 390 | 750 |      | 1000 | 1000 | 1000 | 1000 | 1000 | 1000 |
| 162 | 7367 | 47 |    | 180 | 390 | 750 |      | 1000 | 1000 | 1000 | 1000 | 1000 | 1000 |
| 163 | 7411 |    | 91 | 180 | 390 | 750 |      | 1000 | 1000 | 1000 | 1000 | 1000 | 1000 |
| 164 | 7458 | 47 | 91 | 180 | 390 | 750 |      | 1000 | 1000 | 1000 | 1000 | 1000 | 1000 |
| 165 | 7500 |    |    |     |     |     | 1500 | 1000 | 1000 | 1000 | 1000 | 1000 | 1000 |
| 166 | 7547 | 47 |    |     |     |     | 1500 | 1000 | 1000 | 1000 | 1000 | 1000 | 1000 |
| 167 | 7591 |    | 91 |     |     |     | 1500 | 1000 | 1000 | 1000 | 1000 | 1000 | 1000 |

It is understood that the variable capacitor 75-1 does not need to go sequentially through each step to achieve a desired total capacitance, but instead can use software to lookup the desired capacitor position to switch to it directly. It is further understood that while the exemplified embodiment uses two sets of coarse capacitors (first coarse capacitors and second coarse capacitors) in other embodiments more or less sets of coarse capacitors can be used. For example, three sets of course capacitors could be used, each with a different capacitance value. It is further understood that the variable capacitance system 55-1 can form part of any one of the impedance matching networks discussed above. For example, a matching network may include an input configured to operably couple to an RF source, an output configured to operably couple to a plasma chamber for manufacturing a semiconductor, and the variable capacitance system 55-1 of FIG. 18A. In other embodiments, the variable capacitance system discussed above can be used in other systems requiring variable capacitance.

Figure 18B:
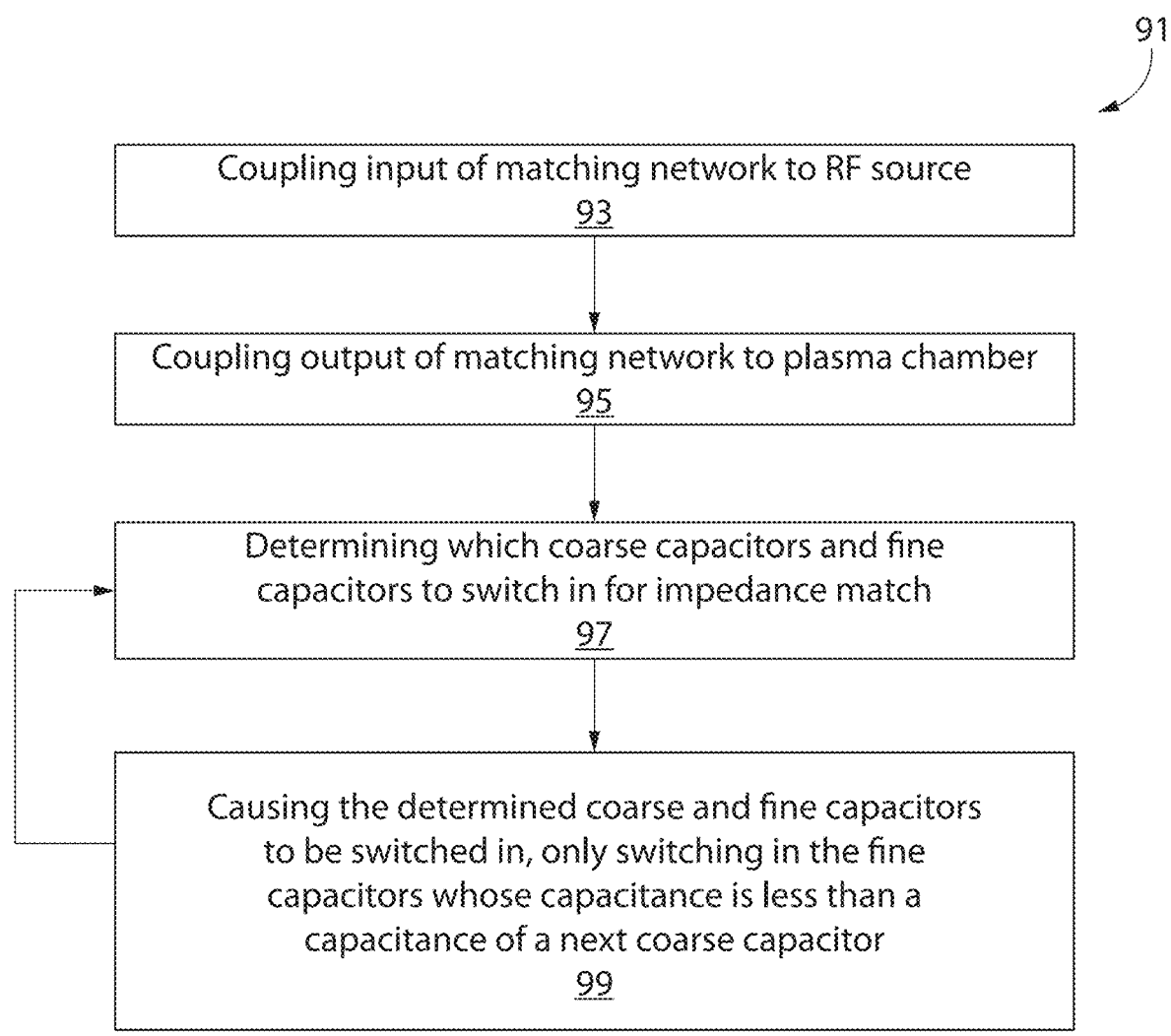
FIG. 18B is a flow chart of a method of matching impedance utilizing a restricted partial binary method for varying capacitance according to one embodiment.

FIG. 18B is a flow chart 91 of a method of matching impedance utilizing a restricted partial binary method for varying capacitance according to one embodiment. An input of a matching network is operably coupled to an RF source (operation 93). Further, an output of the matching network is operably coupled to a plasma chamber for manufacturing a semiconductor (operation 95). The matching network includes the variable capacitance system discussed above. The control unit determines which of the coarse capacitors and the fine capacitors to have switched in to achieve an impedance match (operation 97). The control circuit then causes the determined coarse and fine capacitors to be switched in (operation 99). The fine capacitors are restricted in being switched into the circuit in the manner described above in discussion of FIG. 18A. A method of manufacturing a semiconductor (such as the system displayed shown in FIG. 1) can also utilize the above restricted partial binary variable capacitance system. Further, a semiconductor processing tool (comprising a plasma camber and impedance matching network) can utilize the above restricted partial binary variable capacitance system, specifically, by incorporating the restricted partial binary variable capacitance system into its matching network.

The restricted partial binary setup described above provides multiple advantages. For example, by restricting one or more fine capacitors from switching in, the setup avoids overlap, that is, instances where there is more than one solution for a given impedance value. Further, the restricted partial binary setup allows the variable capacitor to provide a large range of capacitance values by allowing for the use of a high percentage of coarse capacitors. Further, the setup avoids large gaps in capacitance values. Further, less capacitors are needed, thus requiring less switches and causing the variable capacitor to take up less area.

Heat Pipe Inductor

As discussed earlier, several problems can result from inductors becoming heated in high-power systems such as matching networks. Several methods for cooling high temperature inductors can be used, such as forced convection (e.g., fans), increasing thermal mass (e.g., heat sink, fins), and water cooling. Each of these methods, however, has drawbacks. For example, forced convection is limited to the air velocity and flow rate produced by one or more fans, and by the exposed surface area of the inductor. Heat sinks and fins improve temperatures marginally, but are confined to the outside edges of the inductors due to their helical shape. Consequently, the middle of the inductor remains at high temperatures. Running cool water through a hollow pipe inductor can be effective at reducing temperatures throughout the component, but this method requires a water source, which is not available in many high-power RF applications.

Figure 19:
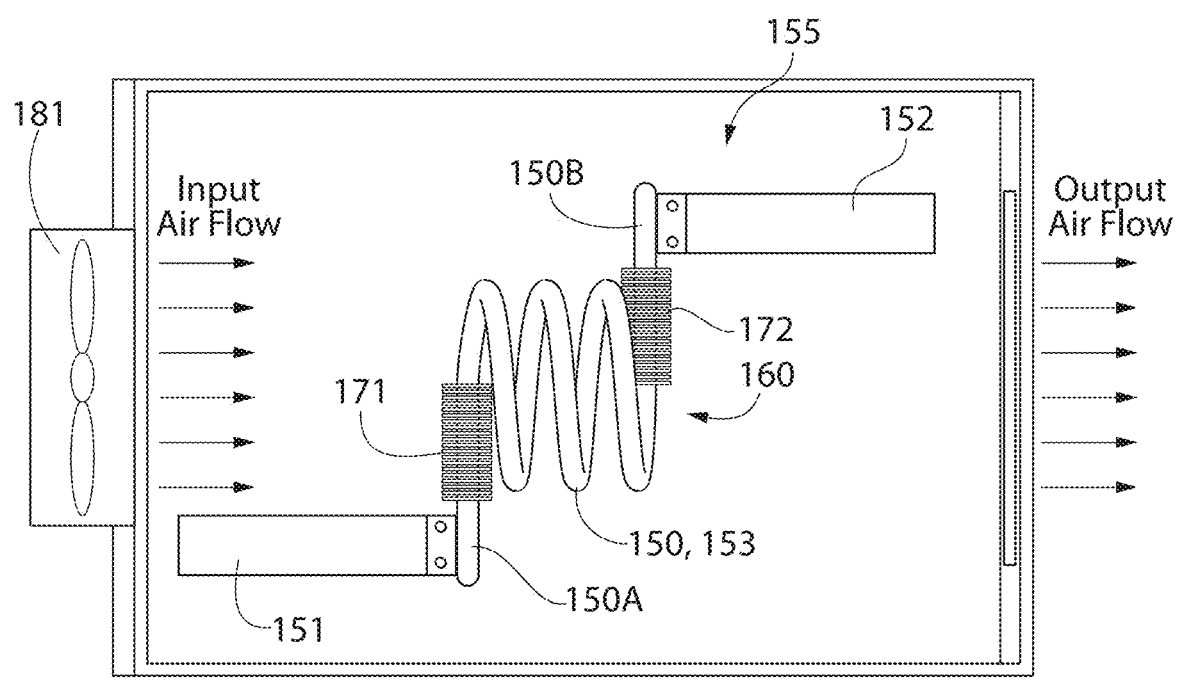
FIG. 19 is a block diagram a portion of a matching network that incorporates a heat pipe inductor according to one embodiment.

FIG. 19 is a block diagram a portion of a matching network 155 that incorporates a heat pipe inductor 150 according to one embodiment. In this embodiment, the portion of the matching network 155 shown includes two variable capacitors 151, 152. The variable capacitors 151, 152 can be similar to the variable capacitors discussed herein, such as C1 and C2. Further, the matching network can include an input configured to operably couple to an RF source (such as, but not limited to, source 30 discussed herein), and an output configured to operably couple to a load (such as, but not limited to, plasma chamber 20 discussed herein). Electric current travels through the matching network causing a power dissipation creating a loss in the form of heat energy. In the exemplified embodiment, the impedance matching network is positioned between an RF source of at least 1 kW and a plasma chamber load for manufacturing semiconductor devices, and the power dissipated in the inductor is about 60-80 W. The invention, however, is not so limited to matching networks for semiconductor manufacturing, as the electronic device 160 can be utilized in any type of matching network, or in other high-power systems having one or more heated inductors.

In the exemplified embodiment, an electronic device 160 is positioned between the capacitors 151, 152. The electronic device may comprise the inductor 150 and heat sinks

171, 172. The inductor is formed from a heat pipe 153 that is wound in a three-dimensional shape. The first heat sink 171 may be coupled adjacent to a first end 150A of the heat pipe 153, and the second heat sink 172 may be coupled adjacent to a second end 150B of the heat pipe 153, the second end 150B being opposite to the first end 150A. In a preferred embodiment, liquid in heat pipe is heated to become vapor. This vapor travels to the heat sink, where it cooled and becomes liquid again.

The matching network 155 of claim 1 may further include a fan 181 configured to blow air across the first and second heat sinks to create forced convection and provide further cooling. The fan 181 may also blow air across the inductor 150.

Figure 20:
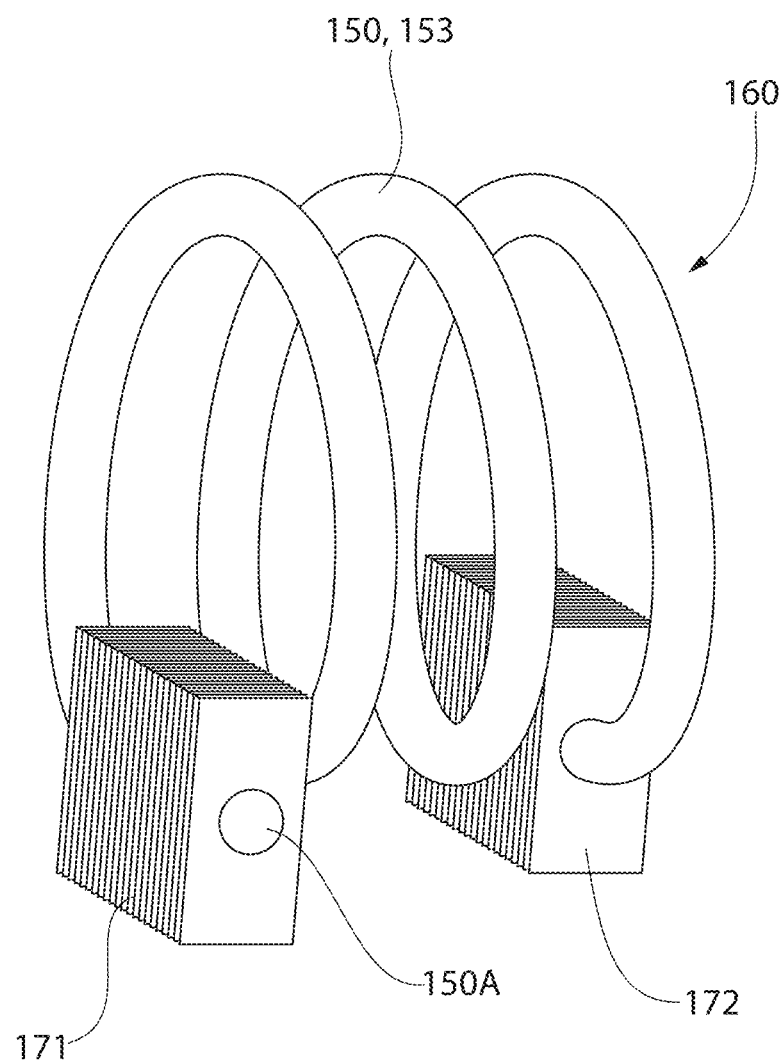
FIG. 20 is a perspective view of an electronic device comprising a heat pipe inductor according to one embodiment.

FIG. 20 is a perspective view of the electronic device 160 of FIG. 19. As stated above, the electronic device includes an inductor 150 formed from a heat pipe 153. A first heat sink is coupled adjacent to a first end 150A of the heat pipe 153, and a second heat sink 172 is be coupled adjacent to a second end (not shown) of the heat pipe 153. As can be seen, the heat pipe 153 may be wound into a three-dimensional shape to form an inductor. In other embodiments, the heat pipe may be wound into other three-dimensional shapes to form an inductor. For example, the heat pipe may be wound into the shape of a cone or toroid.

Heat pipes utilize phase transition, in addition to thermal conductivity, to move thermal energy more efficiently than a solid conductor alone. When the ends of the heat pipe inductor are in contact with a heat sink, the resulting maximum temperature is a fraction of a solid pipe or tube inductor, even with minimal air flow.

Figure 21:
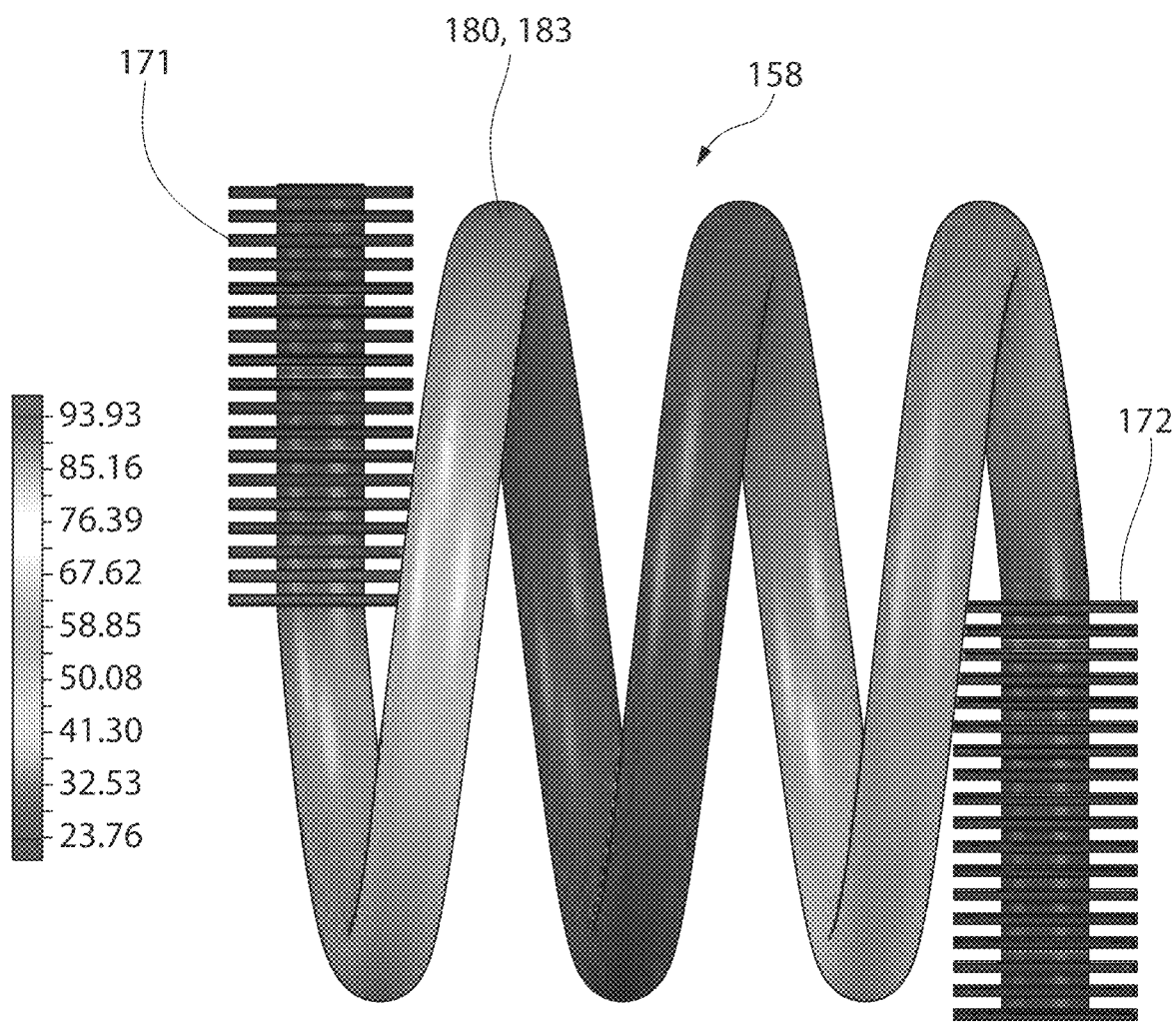
FIGS. 21-23 are surface temperature plots for simulations of heat distribution in a solid copper pipe inductive device, a cobber tube inductive device, and a heat pipe inductive device, respectively, according to one embodiment.
Figure 22:
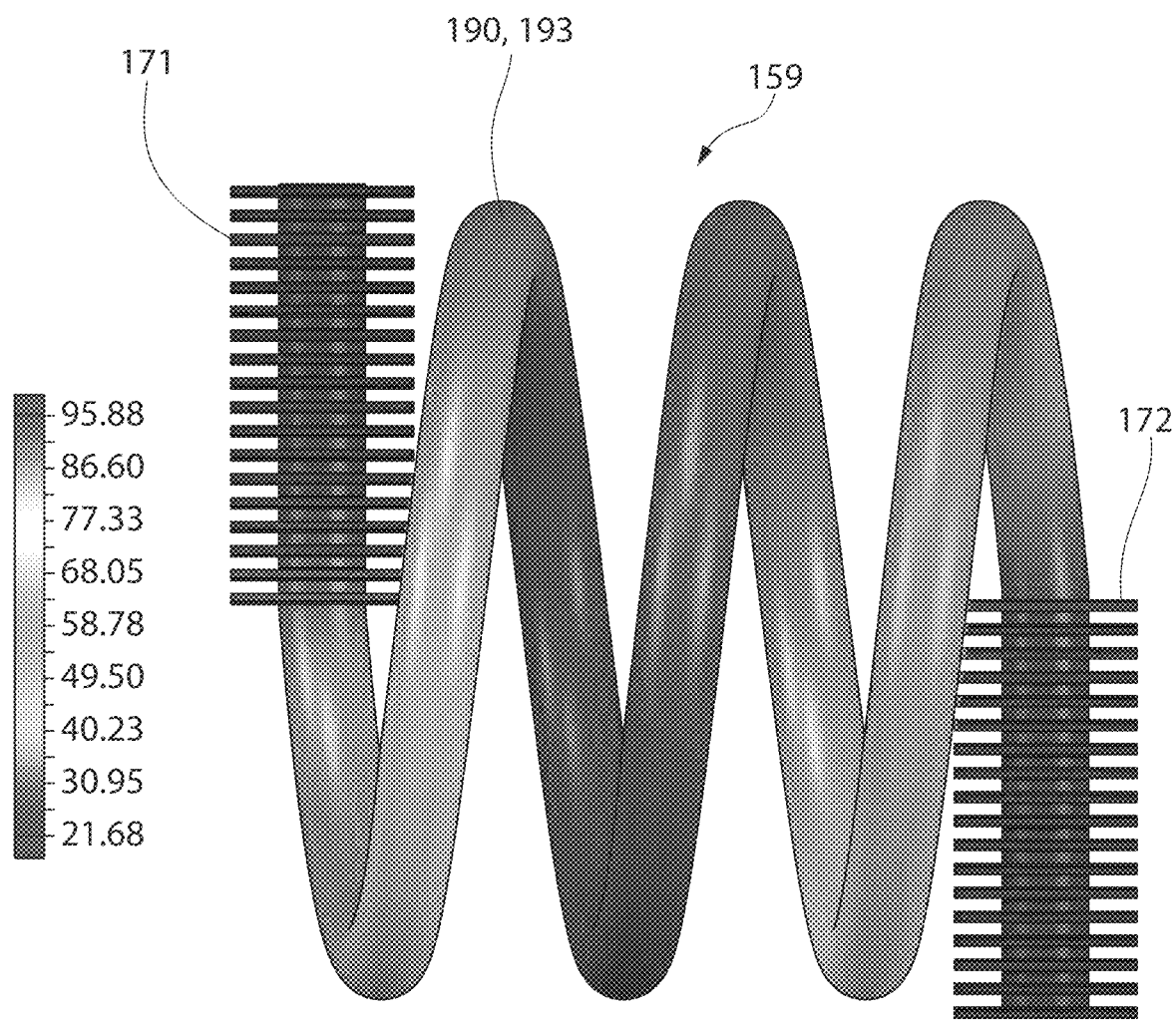
Figure 23:
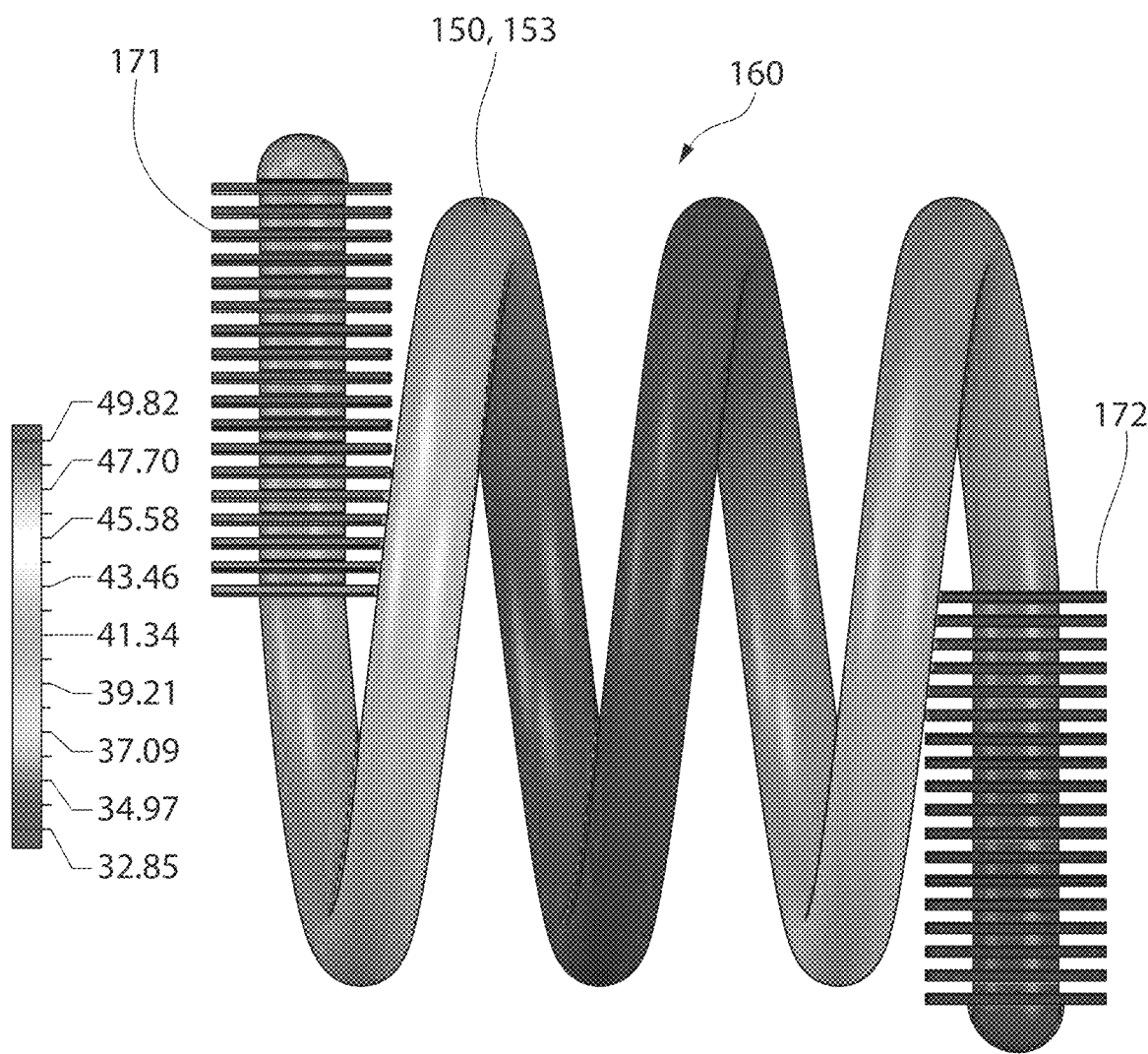

FIGS. 21-23 are temperature surface plots for simulations of heat distribution in a solid copper pipe inductive device (FIG. 21), a copper tube inductive device (FIG. 22), and a heat pipe inductive device (FIG. 23), respectively, according to one embodiment. These simulations were conducted to validate the effective heat transfer of the heat pipe inductive device 160. The computational domain, boundary conditions, and power dissipation are identical across all three simulations. The type of inductor (solid pipe, tube, and heat pipe) is the only parameter altered between simulations.

The simulations were performed inside a 12"×8"×8" adiabatic box. The box had a 6.5-inch diameter opening where a constant, uniform flow of air moved into the box at 8 m/s. On the other side is a 7"×7" environmental pressure opening that serves as the outlet condition. The inductor in each simulation received 80 W of power dissipation. The power dissipation is defined as a surface loss, to account for the skin effect. All three inductor variations were given an outer diameter of ⅜ inches. They were wound with three turns at a pitch of 1 inch and center-to-center helical diameter of 3 inches. The ends, or legs, of the inductors had 1.75 inches of extra material where 18 aluminum heat fins (1.5"×0.75"×0.04") of heat sinks were attached with 0.06-inch spacing between them. This set up can be seen in FIGS. 21-23. It is noted that the invention is not limited to the above specifications, as other design parameters and conditions may be used. For example, while the exemplified inductor 150 has 3 turns, any number of turns can be utilized.

Three simulations were conducted using three different types of ⅜-inch OD copper winding. The results from the simulations can be seen in the temperature surface plots of FIGS. 21-23. The color-coordinated charts show the coils maximum surface temperature (red) and minimum surface temperature (blue). FIG. 21 is an electronic device 158 where the inductor 180 is formed from a solid copper pipe 183. FIG. 22 is an electronic device 159 where the inductor 190 is formed from a copper tubing with a ⅛-inch-thick wall 193. FIG. 23 is an electronic device 160 similar to that shown in FIG. 20, where the inductor 150 is formed from a heat pipe 153. For each of the electronic devices 158, 159, 160, heat sinks 171, 172 are positioned at the ends of the pipe or tube.

As is shown, the heat pipe inductor 150 of FIG. 23 more efficiently transfers its thermal energy to the ends of the pipe where the heat fins then spread the energy across a large surface area exposed to forced convection. While the solid copper pipe inductor 180 has a maximum temperature of 93.93° C., and the copper tubing inductor 190 has a maximum temperature of 95.88° C., the heat pipe inductor 150 has a maximum temperature of only 49.82° C. Further, the heat in the heat pipe inductor 150 is spread more evenly, having a range of 32.85-49.82° C., as opposed to 23.76-93.93° C. for the solid copper pipe inductor 180, and 21.68-95.88° C. for the copper tube inductor 190. The heat pipe inductor 150 provides an inductor whose maximum temperature is 85% cooler than the solid copper pipe inductor 180, and 87% cooler than the copper tube inductor 190.

Figure 24:
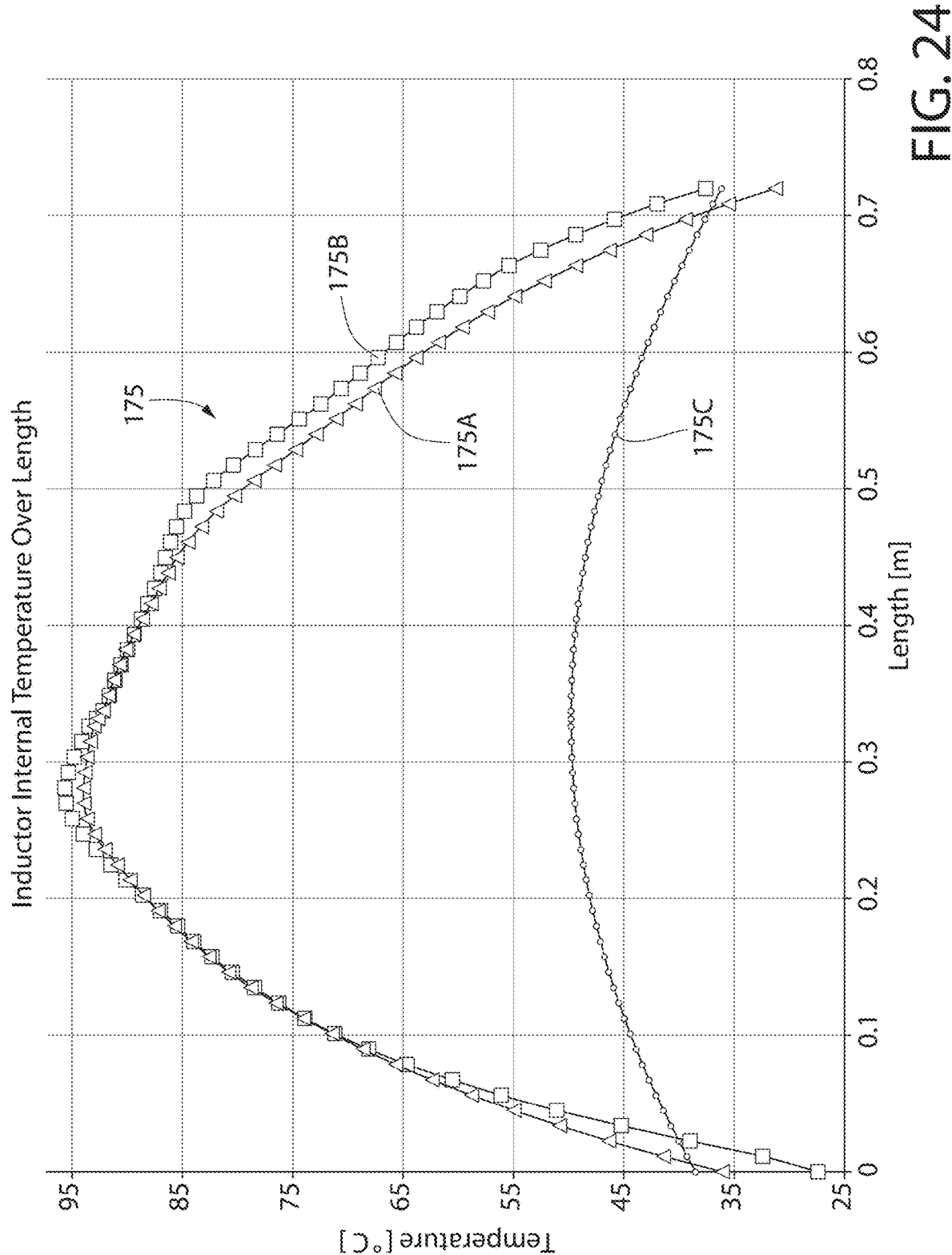
FIG. 24 is a graph of inductor internal temperatures for the simulations of FIGS. 21-23.

Whiles FIGS. 21-23 indicate outer surface temperatures, FIG. 24 is a graph 175 of the inductor internal temperatures for the simulations of FIGS. 21-23. As can be seen, the graphs indicate internal temperature over the length of the inductor coil, with the inductor being hottest at the middle section of the coil. Three plots are shown, a solid copper pipe plot 175A, a copper tube plot 175B, and a heat pipe plot 175C. As shown, the heat pipe inductor remains significantly cooler that the other inductors. The maximum temperature for the heat pipe plot 175C is over 40° C. lower than the other plots 175A, 175B. Further, the heat pipe inductor's range of temperatures fluctuates to a much lesser extent, having a range of 36.25° C. to 49.8° C. Below is a table showing the inductor internal temperature values over the length of the inductor. It is noted that these internal values are similar to the surface values discussed above.

TABLE 2

Inductor Internal Temperature

| Length [m] | Heat Pipe Temp. [° C.] | Tube Temp. [° C.] | Solid Pipe Temp. [° C.] |
| --- | --- | --- | --- |
| 0.00 | 38.5 | 27.4 | 36.1 |
| 0.01 | 39.3 | 32.4 | 41.4 |
| 0.02 | 40.0 | 39.0 | 46.3 |
| 0.03 | 40.7 | 45.2 | 50.8 |
| 0.04 | 41.4 | 51.1 | 55.0 |
| 0.06 | 42.1 | 56.1 | 58.8 |
| 0.07 | 42.7 | 60.5 | 62.4 |
| 0.08 | 43.3 | 64.6 | 65.7 |
| 0.09 | 43.9 | 68.1 | 68.7 |
| 0.10 | 44.4 | 71.2 | 71.4 |
| 0.11 | 44.9 | 73.9 | 74.0 |
| 0.12 | 45.4 | 76.3 | 76.5 |
| 0.13 | 45.9 | 78.5 | 78.8 |
| 0.15 | 46.3 | 80.5 | 80.8 |
| 0.16 | 46.7 | 82.3 | 82.6 |
| 0.17 | 47.1 | 83.9 | 84.2 |
| 0.18 | 47.5 | 85.4 | 85.7 |
| 0.19 | 47.8 | 87.0 | 87.2 |
| 0.20 | 48.2 | 88.6 | 88.5 |
| 0.21 | 48.4 | 90.1 | 89.7 |
| 0.22 | 48.7 | 91.5 | 90.9 |
| 0.24 | 48.9 | 92.8 | 92.0 |
| 0.25 | 49.1 | 94.0 | 93.0 |
| 0.26 | 49.3 | 95.0 | 93.6 |
| 0.27 | 49.4 | 95.5 | 93.9 |
| 0.28 | 49.6 | 95.7 | 94.0 |

TABLE 2-continued

Inductor Internal Temperature

| Length [m] | Heat Pipe Temp. [° C.] | Tube Temp. [° C.] | Solid Pipe Temp. [° C.] |
|---|---|---|---|
| 0.29 | 49.6 | 95.3 | 93.8 |
| 0.30 | 49.7 | 94.8 | 93.6 |
| 0.31 | 49.8 | 94.1 | 93.4 |
| 0.33 | 49.8 | 93.5 | 93.0 |
| 0.33 | 49.8 | 92.8 | 92.7 |
| 0.34 | 49.8 | 92.2 | 92.2 |
| 0.35 | 49.8 | 91.6 | 91.7 |
| 0.36 | 49.7 | 91.1 | 91.2 |
| 0.37 | 49.7 | 90.6 | 90.7 |
| 0.38 | 49.6 | 90.0 | 90.1 |
| 0.39 | 49.4 | 89.4 | 89.4 |
| 0.40 | 49.3 | 88.7 | 88.6 |
| 0.42 | 49.1 | 88.1 | 87.8 |
| 0.43 | 48.9 | 87.5 | 87.1 |
| 0.44 | 48.7 | 86.9 | 86.3 |
| 0.45 | 48.5 | 86.5 | 85.5 |
| 0.46 | 48.3 | 86.1 | 84.5 |
| 0.47 | 48.0 | 85.5 | 83.3 |
| 0.48 | 47.7 | 84.8 | 81.9 |
| 0.49 | 47.3 | 83.7 | 80.3 |
| 0.51 | 47.0 | 82.2 | 78.5 |
| 0.52 | 46.6 | 80.4 | 76.7 |
| 0.53 | 46.2 | 78.4 | 74.8 |
| 0.54 | 45.8 | 76.4 | 72.9 |
| 0.55 | 45.3 | 74.4 | 71.1 |
| 0.56 | 44.8 | 72.5 | 69.4 |
| 0.57 | 44.4 | 70.6 | 67.6 |
| 0.58 | 43.9 | 68.9 | 65.7 |
| 0.60 | 43.3 | 67.3 | 63.8 |
| 0.61 | 42.8 | 65.6 | 61.8 |
| 0.62 | 42.2 | 63.8 | 59.6 |
| 0.63 | 41.6 | 61.9 | 57.4 |
| 0.64 | 41.0 | 59.9 | 54.9 |
| 0.65 | 40.4 | 57.7 | 52.2 |
| 0.66 | 39.7 | 55.4 | 49.4 |
| 0.67 | 39.0 | 52.6 | 46.3 |
| 0.69 | 38.4 | 49.4 | 43.0 |
| 0.70 | 37.6 | 45.8 | 39.4 |
| 0.71 | 36.9 | 42.0 | 35.5 |
| 0.72 | 36.2 | 37.6 | 31.3 |

For a given application, the heat pipe design (e.g., diameter, length, and working fluid) is driven by the specific amount of power that needs to be moved. Generally, larger-diameter pipes can move more heat. High-power application will favor larger-diameter pipes, and inductor shapes that allow larger-diameter pipes, such as the cylinder shape shown in the above discussed embodiments. A shape that required small, thin wire would not be ideal for a high-power application. Further, heat pipes have limits on how much heat they can move. If the power dissipation in the inductor is too great for the selected heat pipe, it will reach a critical point where the gas inside is not able to condense, making the heat pipe non-functional. The type of heat sink used would also be dependent upon the amount of power dissipated through the inductor. For example, as power dissipation increases, fins on the sink may increase in size and/or quantity.

Figure 25:
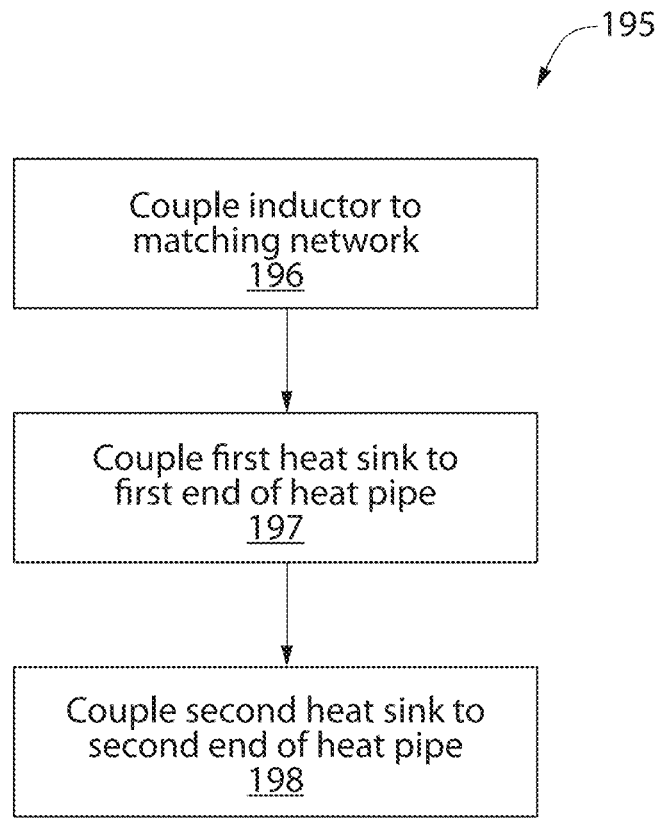
FIG. 25 is a flow chart of a method for cooling an impedance matching network according to one embodiment.

FIG. 25 is a flow chart of a method 195 for cooling an impedance matching network according to one embodiment. In this embodiment, an inductor is coupled to the matching network, the inductor formed from a heat pipe that is wound in a three-dimensional shape (operation 196). Further, a first heat sink to a first end of the heat pipe (operation 197), and a second heat sink is coupled to a second, opposite end of the heat pipe (operation 198). Use of this heat pipe inductor with heat sinks enables improved cooling of the inductor, and thus of the matching network.

As discussed, a matching network utilizing such a heat pipe inductor can be utilized in a system or method for manufacturing of semiconductors. According to such a method, a matching network may be operably coupled between an RF source and a plasma chamber, the plasma chamber configured to deposit a material layer onto the substrate or etch a material layer from the substrate. The matching network may include an input configured to operably couple to the RF source, an output configured to operably couple to the plasma chamber, a first variable capacitor, an inductor formed from a heat pipe that is wound in a three-dimensional shape, a first heat sink coupled adjacent to a first end of the heat pipe, and a second heat sink coupled adjacent to a second, opposite end of the heat pipe. A substrate may be placed in the plasma chamber, and the plasma may be energized within the plasma chamber by coupling RF power from the RF source into the plasma chamber to perform a deposition or etching. The capacitance of the first variable capacitor may be controlled to achieve an impedance match. While the above embodiments discuss using one or more variable capacitors in a matching network to achieve an impedance match, it is noted that any variable reactance element can be used. A variable reactance element can include one or more reactance elements, where a reactance element is a capacitor or inductor or similar reactive device.

The embodiments discussed herein provide many advantages. As shown by the foregoing simulations, the heat pipe inductor provides dramatic cooling improvements. The disclosed embodiments can provide improved cooling performance while saving space, which is valuable in matching networks for semiconductor manufacturing, as well as certain other high-power applications. Further, the heat pipe inductor is particularly useful in cooling the middle portions of the inductor, without requiring other resources such as a regular water source.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

While the invention or inventions have been described with respect to specific examples, those skilled in the art will appreciate that there are numerous variations and permutations of the above described invention(s). It is to be understood that other embodiments may be utilized and structural and functional modifications may be made without departing from the scope of the present invention(s). Thus, the spirit and scope should be construed broadly as set forth in the appended claims.

What is claimed is:

1. An impedance matching network comprising:
   an input configured to operably couple to a radio frequency (RF) source;
   an output configured to operably couple to a plasma chamber for manufacturing a semiconductor;
   a variable capacitor comprising:
      a plurality of capacitors operably coupled in parallel, the plurality of capacitors comprising:
         coarse capacitors comprising (a) first coarse capacitors each having a substantially similar first coarse capacitance; and (b) second coarse capacitors each having a substantially similar second coarse capacitance; and fine capacitors having different capacitances that increase in value, wherein at least one of the fine capacitors has a capacitance greater than the first coarse capacitance;
a plurality of switches, wherein each switch of the plurality of switches is operably coupled in series with a corresponding capacitor of the plurality of capacitors and configured to switch in and out the corresponding capacitor;
wherein each capacitor of the plurality of capacitors provides a change to a total capacitance of the variable capacitor when the capacitor is switched in;
a control circuit operably coupled to the variable capacitor, the control circuit configured to (a) determine which of the coarse capacitors and the fine capacitors to have switched in to achieve an impedance match and (b) cause the determined coarse and fine capacitors to be switched in;
wherein the control circuit is further configured to cause a gradual increase in the total capacitance of the variable capacitor by:
switching in, in a predetermined order, each of the first coarse capacitors, followed by each of the second coarse capacitors; and
only switching in the fine capacitors whose capacitance is less than a capacitance of a next coarse capacitor of the coarse capacitors predetermined to be switched in next.

2. The matching network of claim 1 wherein only one of the fine capacitors has a capacitance greater than the first coarse capacitance.

3. The matching network of claim 2 wherein the one fine capacitor having a capacitance greater than the first coarse capacitance is restricted from switching in until all the first coarse capacitors are switched in.

4. The matching network of claim 1 wherein the control circuit is further configured to:
determine the variable impedance of the plasma chamber;
determine which of the coarse capacitors and the fine capacitors to have switched in to achieve an impedance match based on the determined variable impedance of the plasma chamber.

5. The matching network of claim 1 wherein the second coarse capacitance is at least twice the first coarse capacitance.

6. The matching network of claim 1 wherein:
the fine capacitors have capacitances substantially equal to 47 pF, 91 pF, 180 pF, 390 pF, 750 pF, 1500 pF;
the first coarse capacitors comprise six capacitors having capacitances substantially equal to 1000 pF;
the second course capacitors comprise twelve capacitors having capacitances substantially equal to 3000 pF; and
the substantially 1500 pF fine capacitor is restricted from switching in until all the first coarse capacitors are switched in.

7. The matching network of claim 1 wherein, for each of the fine capacitors increasing in capacitance, the change to the total capacitance that is provided by the fine capacitor when its corresponding switch is closed increases by a factor of about two.

8. A semiconductor processing tool comprising:
a plasma chamber configured to deposit a material onto a substrate or etch a material from the substrate; and
an impedance matching circuit operably coupled to the plasma chamber, matching circuit comprising:
an input configured to operably couple to an RF source;
an output configured to operably couple to the plasma chamber for manufacturing a semiconductor;
a variable capacitor comprising:
a plurality of capacitors operably coupled in parallel, the plurality of capacitors comprising:
coarse capacitors comprising (a) first coarse capacitors each having a substantially similar first coarse capacitance; and (b) second coarse capacitors each having a substantially similar second coarse capacitance; and
fine capacitors having different capacitances that increase in value, wherein at least one of the fine capacitors has a capacitance greater than the first coarse capacitance;
a plurality of switches, wherein each switch of the plurality of switches is operably coupled in series with a corresponding capacitor of the plurality of capacitors and configured to switch in and out the corresponding capacitor;
wherein each capacitor of the plurality of capacitors provides a change to a total capacitance of the variable capacitor when the capacitor is switched in;
a control circuit operably coupled to the variable capacitor, the control circuit configured to (a) determine which of the coarse capacitors and the fine capacitors to have switched in to achieve an impedance match and (b) cause the determined coarse and fine capacitors to be switched in;
wherein the control circuit is further configured to cause a gradual increase in the total capacitance of the variable capacitor by:
switching in, in a predetermined order, each of the first coarse capacitors, followed by each of the second coarse capacitors; and
only switching in the fine capacitors whose capacitance is less than a capacitance of a next coarse capacitor of the coarse capacitors predetermined to be switched in next.

9. The tool of claim 8 wherein only one of the fine capacitors has a capacitance greater than the first coarse capacitance.

10. The tool of claim 9 wherein the one fine capacitor having a capacitance greater than the first coarse capacitance is restricted from switching in until all the first coarse capacitors are switched in.

11. The tool of claim 8 wherein the control circuit is further configured to:
determine the variable impedance of the plasma chamber;
determine which of the coarse capacitors and the fine capacitors to have switched in to achieve an impedance match based on the determined variable impedance of the plasma chamber.

12. The tool of claim 8 wherein the second coarse capacitance is at least twice the first coarse capacitance.

13. The tool of claim 8 wherein, for each of the fine capacitors increasing in capacitance, the change to the total capacitance that is provided by the fine capacitor when its corresponding switch is closed increases by a factor of about two.

14. A method of matching an impedance comprising:
operably coupling an input of a matching network to an RF source;
operably coupling an output of the matching network to a plasma chamber for manufacturing a semiconductor, the matching network comprising:

a variable capacitor comprising:
  a plurality of capacitors operably coupled in parallel, the plurality of capacitors comprising:
    coarse capacitors comprising (a) first coarse capacitors each having a substantially similar first coarse capacitance; and (b) second coarse capacitors each having a substantially similar second coarse capacitance; and
    fine capacitors having different capacitances that increase in value, wherein at least one of the fine capacitors has a capacitance greater than the first coarse capacitance;
  a plurality of switches, wherein each switch of the plurality of switches is operably coupled in series with a corresponding capacitor of the plurality of capacitors and configured to switch in and out the corresponding capacitor;
  wherein each capacitor of the plurality of capacitors provides a change to a total capacitance of the variable capacitor when the capacitor is switched in; and
  a control circuit;
determining, by the control circuit, which of the coarse capacitors and the fine capacitors to have switched in to achieve an impedance match; and
causing, by the control circuit, the determined coarse and fine capacitors to be switched in;
wherein the control circuit is further configured to cause a gradual increase in the total capacitance of the variable capacitor by:
  switching in, in a predetermined order, each of the first coarse capacitors, followed by each of the second coarse capacitors; and
  only switching in the fine capacitors whose capacitance is less than a capacitance of a next coarse capacitor of the coarse capacitors predetermined to be switched in next.

15. The method of claim 14 wherein only one of the fine capacitors has a capacitance greater than the first coarse capacitance.

16. The method of claim 15 wherein the one fine capacitor having a capacitance greater than the first coarse capacitance is restricted from switching in until all the first coarse capacitors are switched in.

17. The method of claim 14 further comprising:
determining, by the control circuit, the variable impedance of the plasma chamber;
determining, by the control circuit, which of the coarse capacitors and the fine capacitors to have switched in to achieve an impedance match based on the determined variable impedance of the plasma chamber.

18. The method of claim 14 wherein the second coarse capacitance is at least twice the first coarse capacitance.

19. The method of claim 14 wherein:
the fine capacitors have capacitances substantially equal to 47 pF, 91 pF, 180 pF, 390 pF, 750 pF, 1500 pF;
the first coarse capacitors comprise six capacitors having capacitances substantially equal to 1000 pF;
the second course capacitors comprise twelve capacitors having capacitances substantially equal to 3000 pF; and
the substantially 1500 pF fine capacitor is restricted from switching in until all the first coarse capacitors are switched in.

20. The method of claim 14 wherein, for each of the fine capacitors increasing in capacitance, the change to the total capacitance that is provided by the fine capacitor when its corresponding switch is closed increases by a factor of about two.

21. A method of manufacturing a semiconductor, the method comprising:
operably coupling an input of a matching network to an RF source;
operably coupling an output of the matching network to a plasma chamber, plasma chamber configured to deposit a material layer onto the substrate or etch a material layer from the substrate, the matching network comprising:
  a variable capacitor comprising:
    a plurality of capacitors operably coupled in parallel, the plurality of capacitors comprising:
      coarse capacitors comprising (a) first coarse capacitors each having a substantially similar first coarse capacitance; and (b) second coarse capacitors each having a substantially similar second coarse capacitance; and
      fine capacitors having different capacitances that increase in value, wherein at least one of the fine capacitors has a capacitance greater than the first coarse capacitance;
    a plurality of switches, wherein each switch of the plurality of switches is operably coupled in series with a corresponding capacitor of the plurality of capacitors and configured to switch in and out the corresponding capacitor;
    wherein each capacitor of the plurality of capacitors provides a change to a total capacitance of the variable capacitor when the capacitor is switched in; and
    a control circuit;
placing a substrate in the plasma chamber;
energizing plasma within the plasma chamber by coupling RF power from the RF source into the plasma chamber to perform a deposition or etching; and
determining, by the control circuit, which of the coarse capacitors and the fine capacitors to have switched in to achieve an impedance match; and
causing, by the control circuit, the determined coarse and fine capacitors to be switched in;
wherein the control circuit is further configured to cause a gradual increase in the total capacitance of the variable capacitor by:
  switching in, in a predetermined order, each of the first coarse capacitors, followed by each of the second coarse capacitors; and
  only switching in the fine capacitors whose capacitance is less than a capacitance of a next coarse capacitor of the coarse capacitors predetermined to be switched in next.

* * * * *